(12) United States Patent
Nakamura

(10) Patent No.: US 7,602,097 B2
(45) Date of Patent: Oct. 13, 2009

(54) MOVABLE DEVICE

(75) Inventor: Shunji Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/237,681

(22) Filed: Sep. 25, 2008

(65) Prior Publication Data
US 2009/0021884 A1   Jan. 22, 2009

Related U.S. Application Data

(63) Continuation of application No. PCT/JP2006/306270, filed on Mar. 28, 2006.

(51) Int. Cl.
*H02N 2/00* (2006.01)
(52) U.S. Cl. .................................. 310/309
(58) Field of Classification Search .................. 310/309
See application file for complete search history.

(56) References Cited

U.S. PATENT DOCUMENTS

| 6,563,238 | B1 | 5/2003 | Lee et al. | |
|---|---|---|---|---|
| 7,355,258 | B2 * | 4/2008 | Valenzuela et al. | 257/415 |
| 2003/0184189 | A1 | 10/2003 | Sinclair | |
| 2007/0029584 | A1 * | 2/2007 | Valenzuela et al. | 257/254 |
| 2009/0021884 | A1 * | 1/2009 | Nakamura | 361/233 |

FOREIGN PATENT DOCUMENTS

| JP | 04-251579 A | 9/1992 |
|---|---|---|
| JP | 2000-171481 A | 6/2000 |
| JP | 2002-287045 A | 10/2002 |
| JP | 2003-225896 A | 8/2003 |
| JP | 2004-001186 A | 1/2004 |
| JP | 2005-166622 A | 6/2005 |
| JP | 2005-23409 A | 8/2005 |
| JP | 2005-262382 A | 9/2005 |
| JP | 2005-262412 A | 9/2005 |
| JP | 2006-41911 A | 2/2006 |

OTHER PUBLICATIONS

International Search Report issued May 23, 2006 in corresponding International Application No. PCT/JP2006/306270.

* cited by examiner

*Primary Examiner*—Thomas M Dougherty
(74) *Attorney, Agent, or Firm*—Westerman, Hattori, Daniels & Adrian, LLP

(57) ABSTRACT

A movable device simultaneously enabling reduction of size down to the submicron level, higher speed operation, a streamlined production process, low costs, and greater reliability. A movable device provided with bottom electrodes and a basic conductive layer fixed to a substrate, an elastic shaft of a carbon nanotube with a bottom end fixed on the basic conductive layer and standing up, and a top structure including a top electrode spaced away from the bottom electrode and fixed to a top end of the elastic shaft, wherein when applying voltage between a bottom electrode and the top electrode, the top electrode displaces relatively to the bottom electrodes within an allowable range of elastic deformation of the elastic shaft.

20 Claims, 25 Drawing Sheets

Fig.4
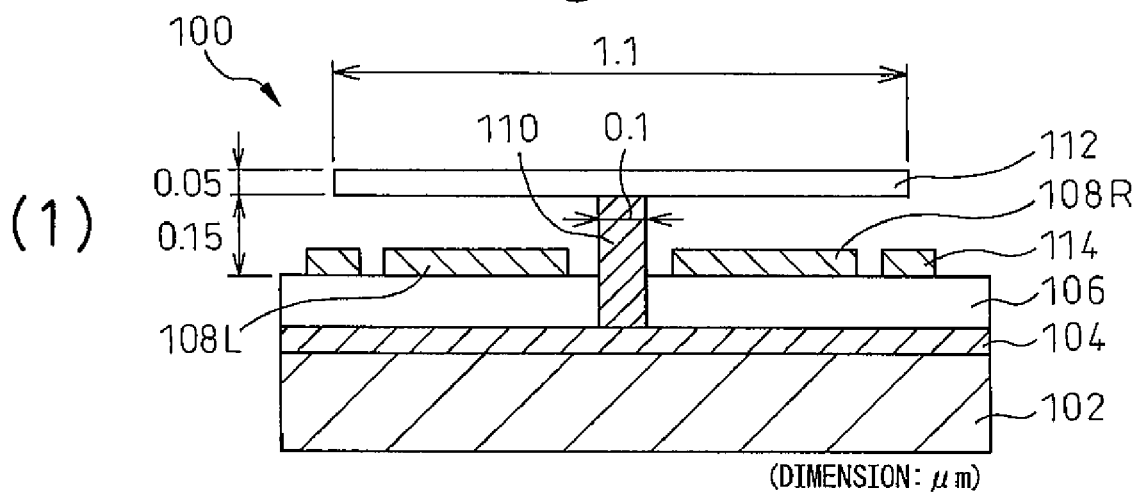
(1)
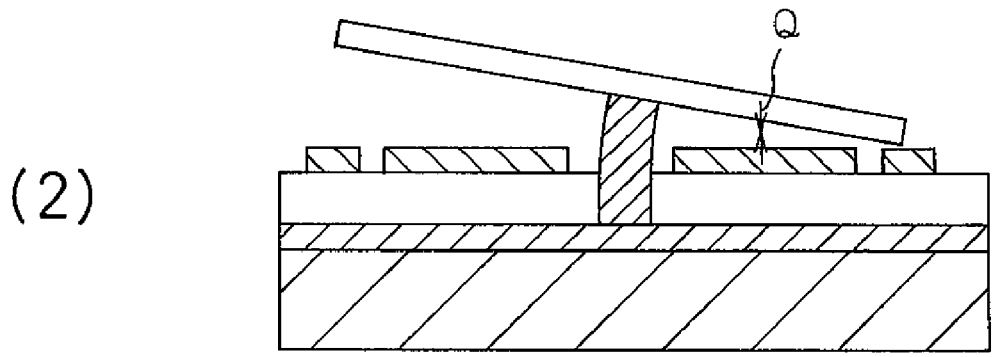
(2)
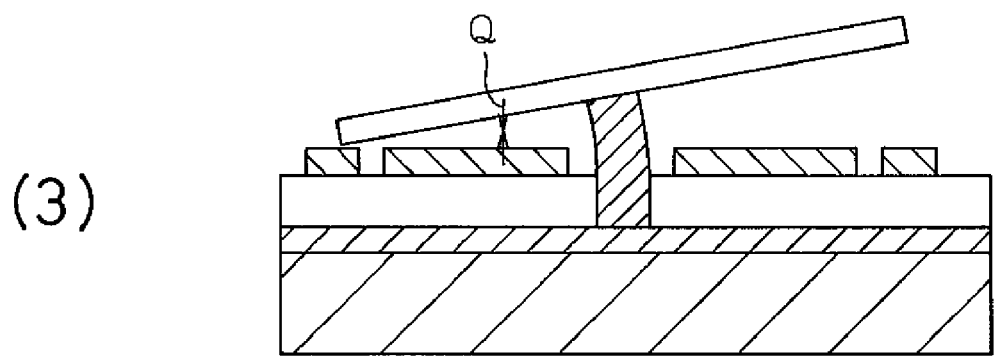
(3)

Fig.9
(1) 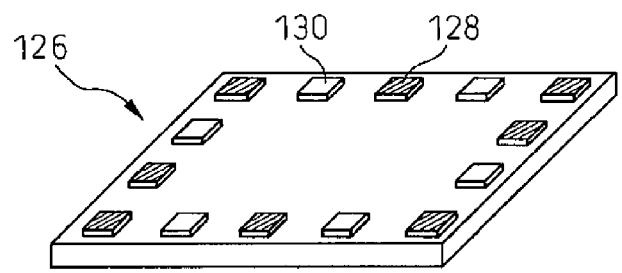
(2) 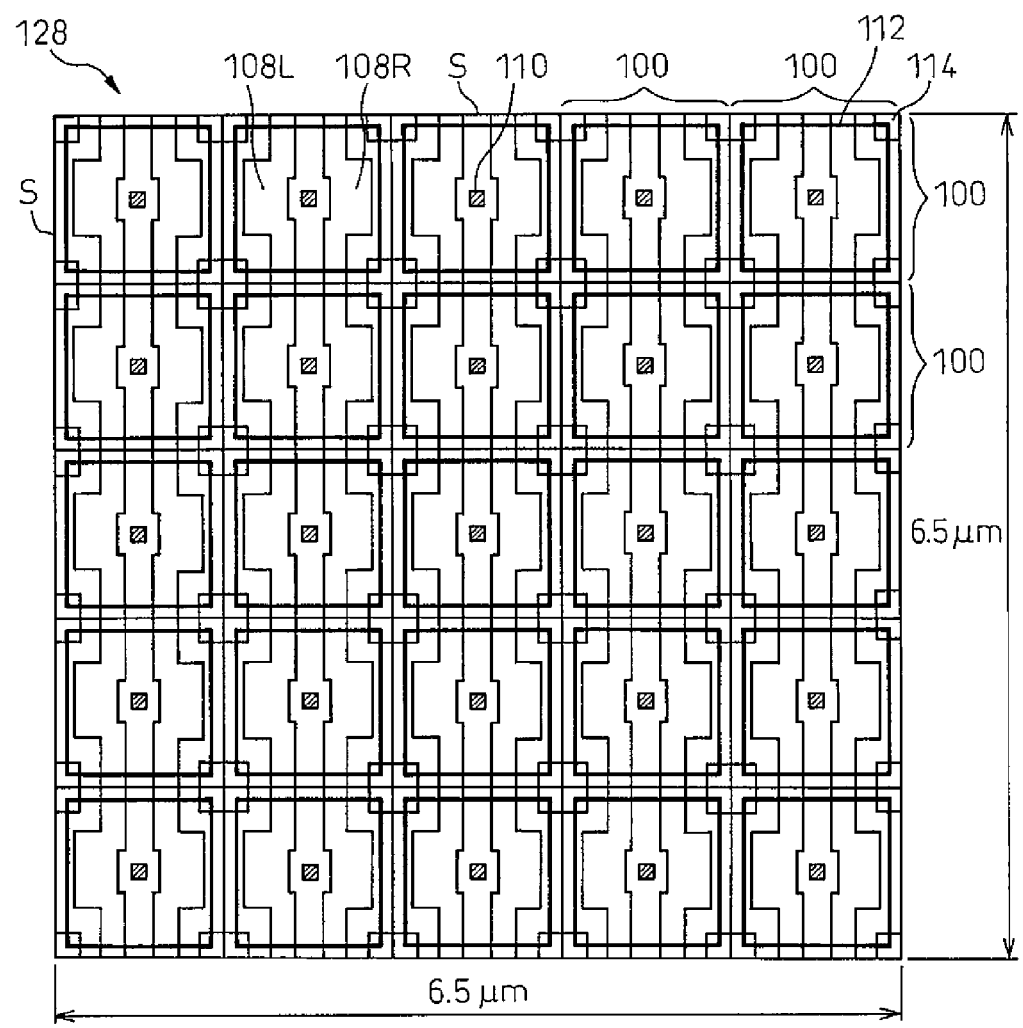

Fig.11
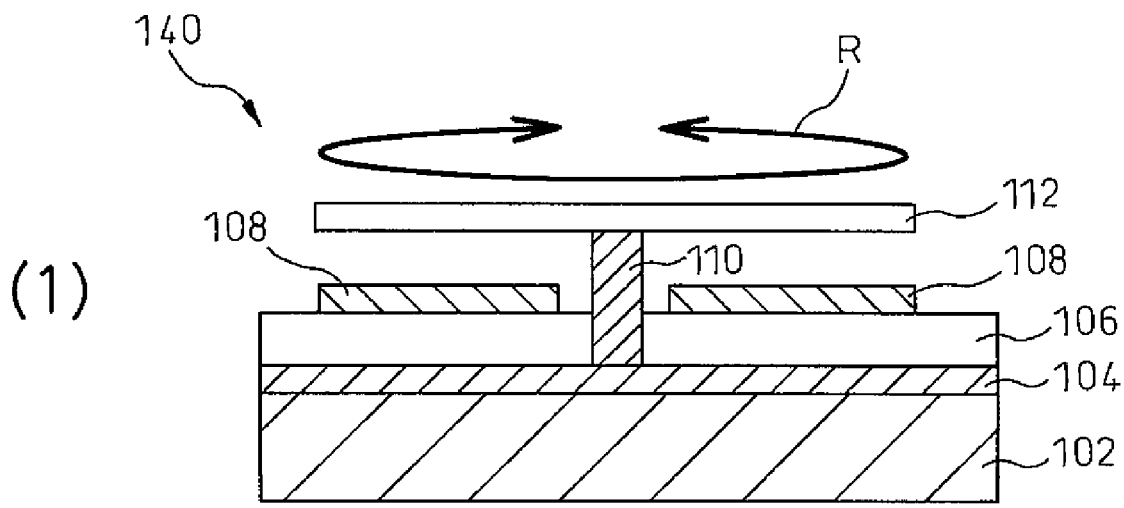
(1)
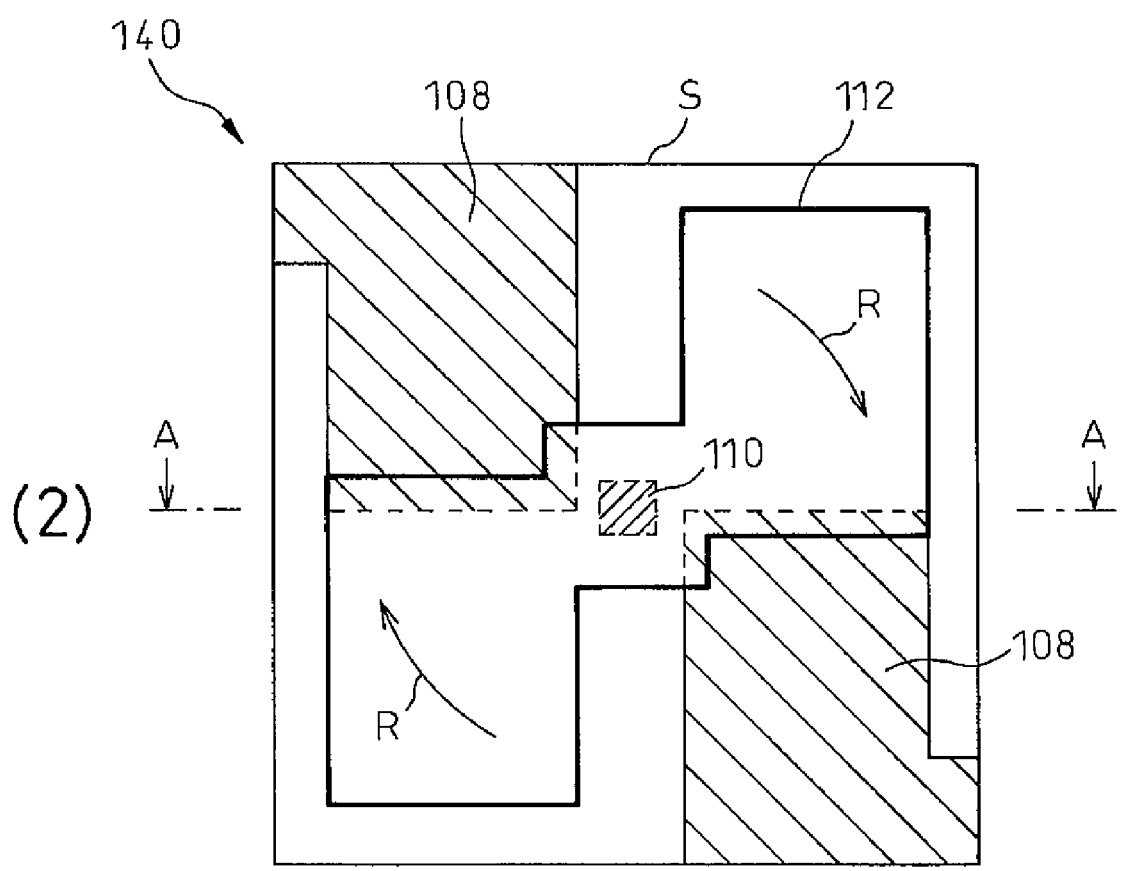
(2)

Fig.15
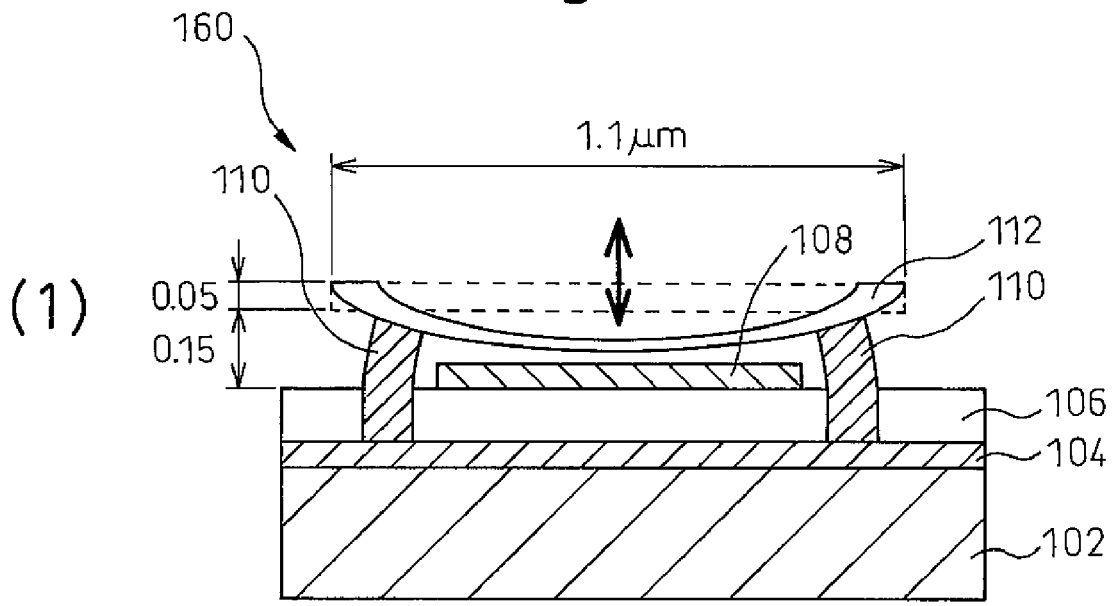
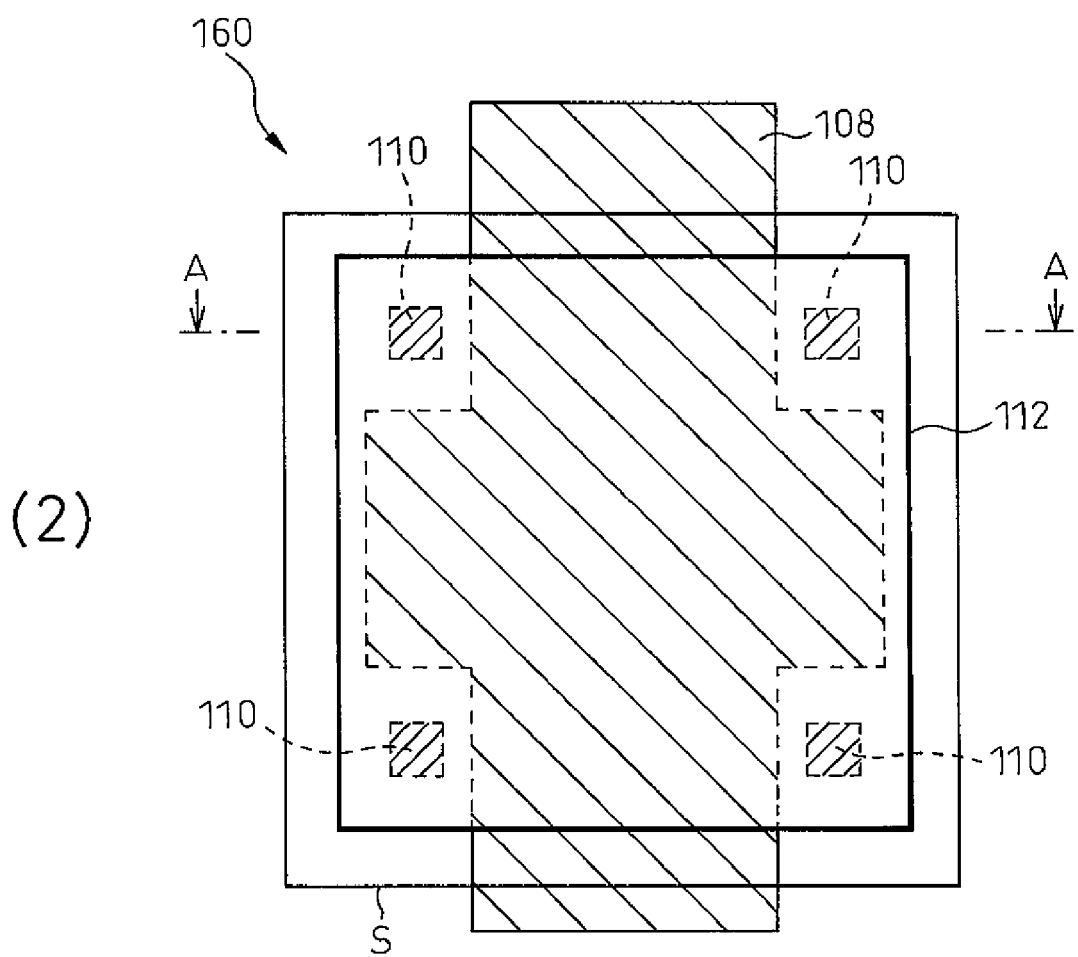

Fig.18
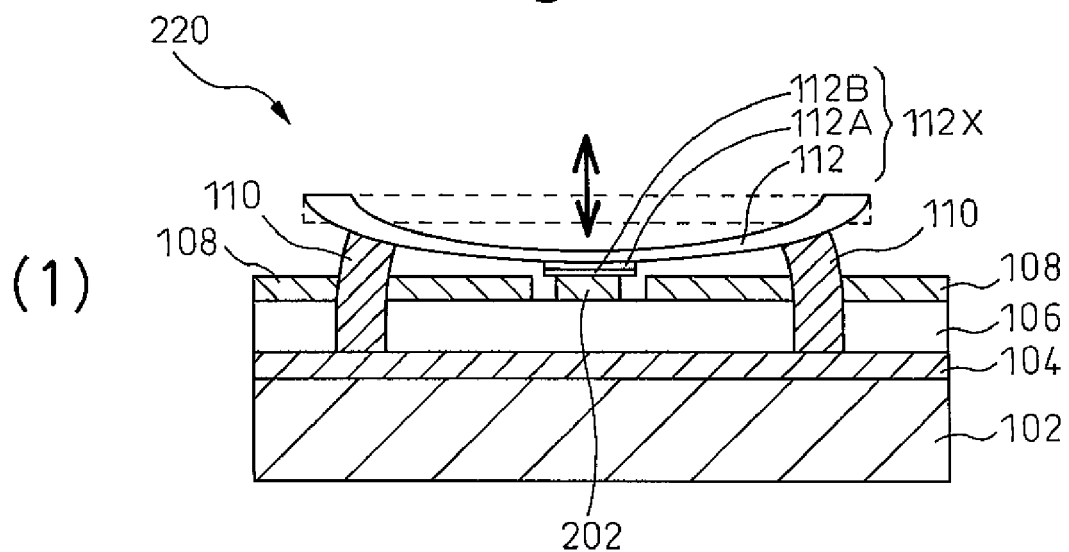
(1)
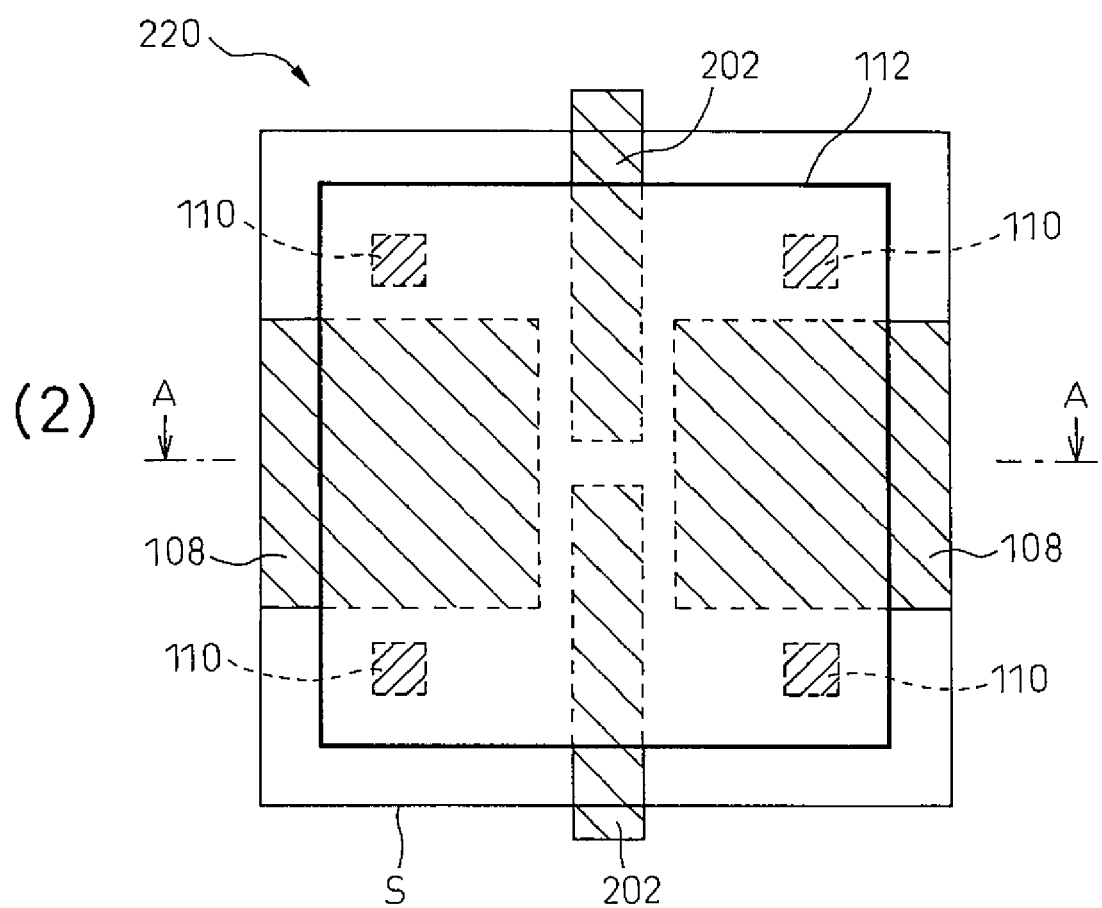
(2)

Fig. 21
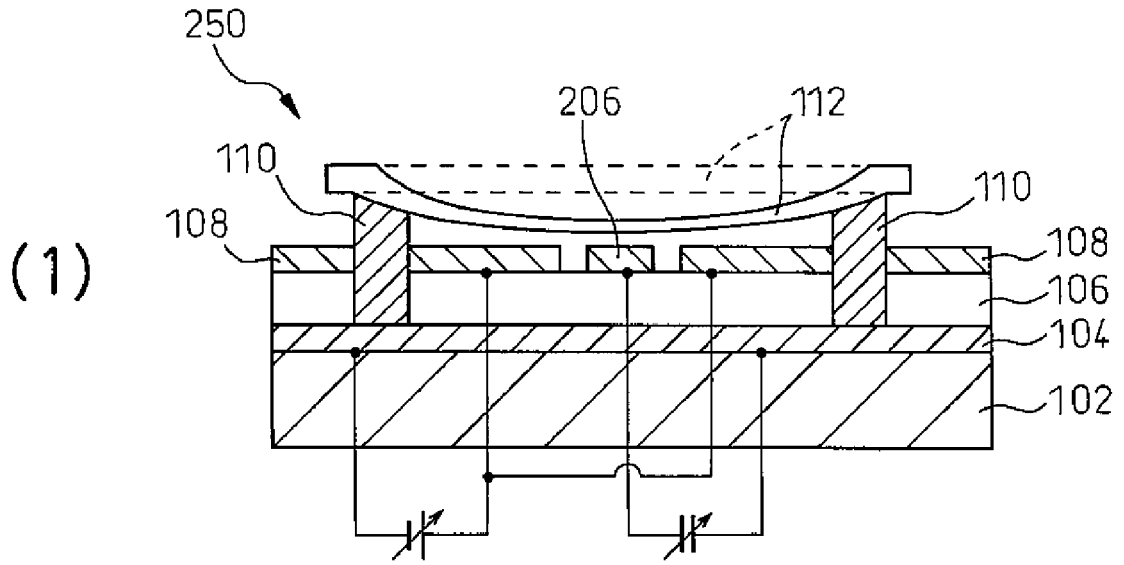
(1)
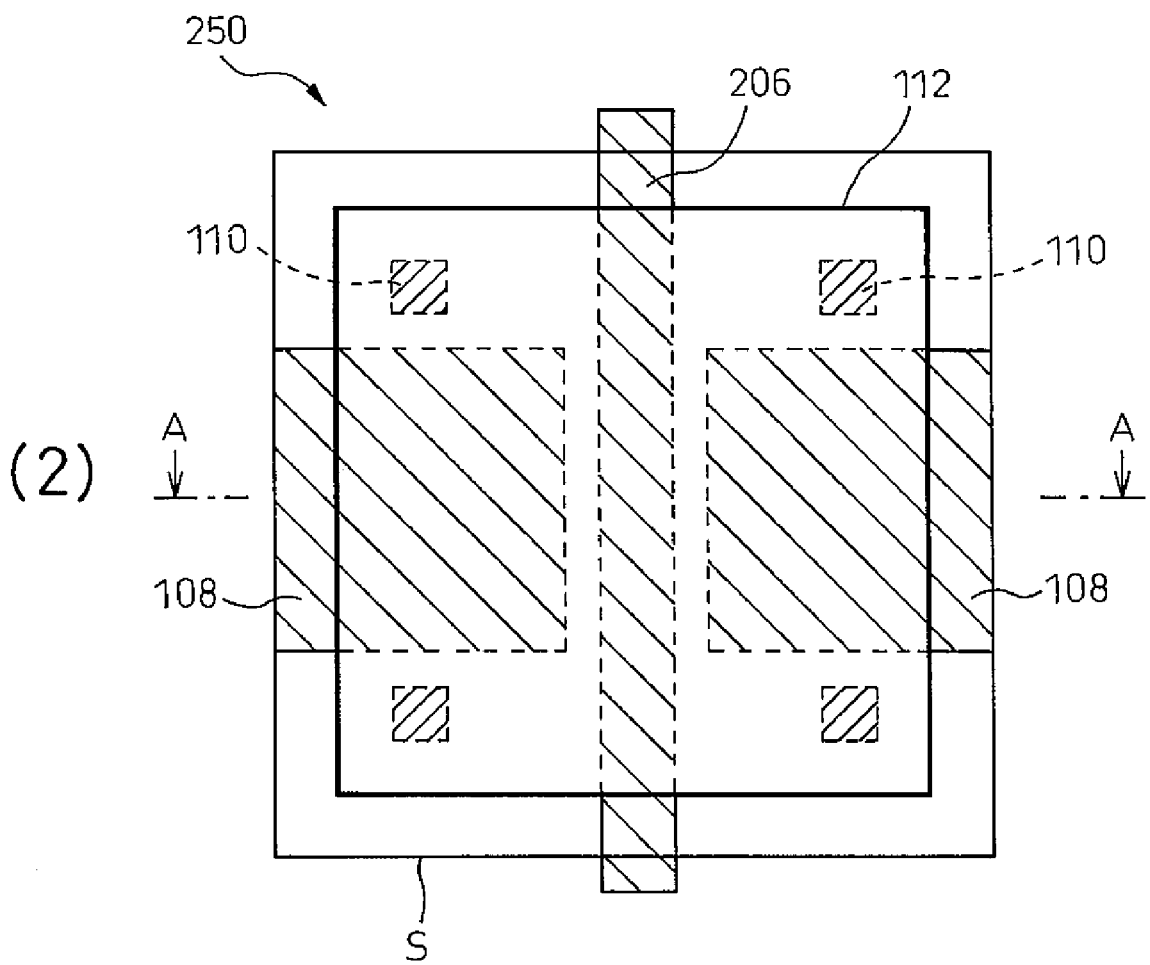
(2)

Fig. 22
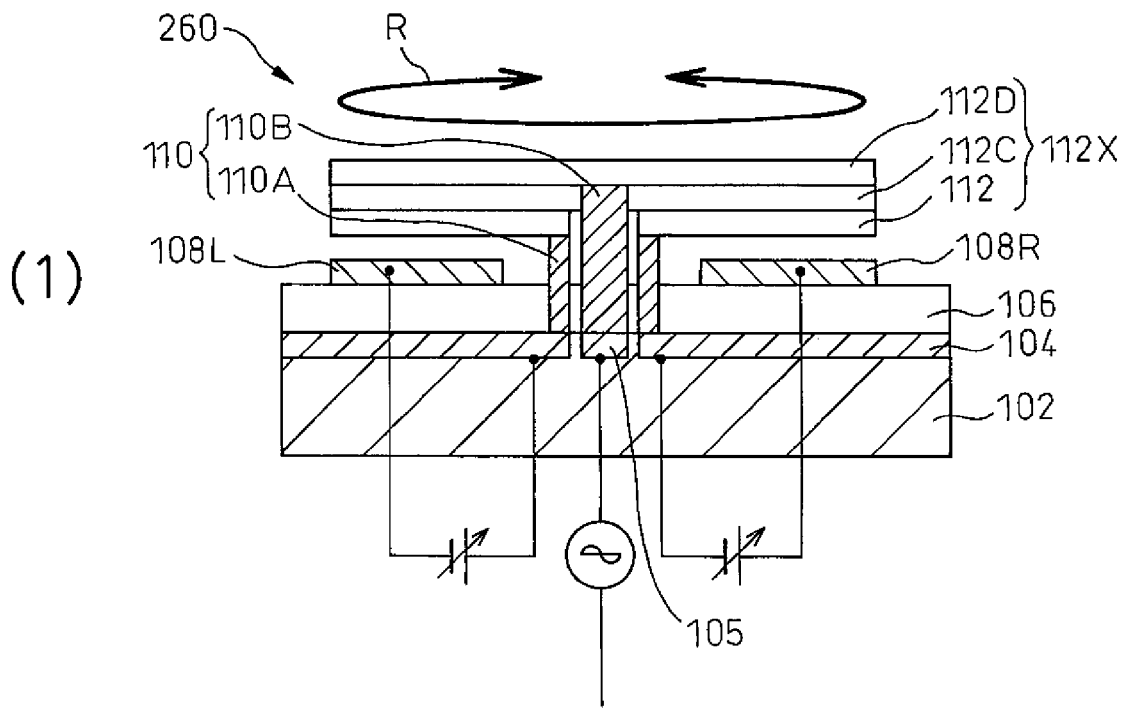
(1)
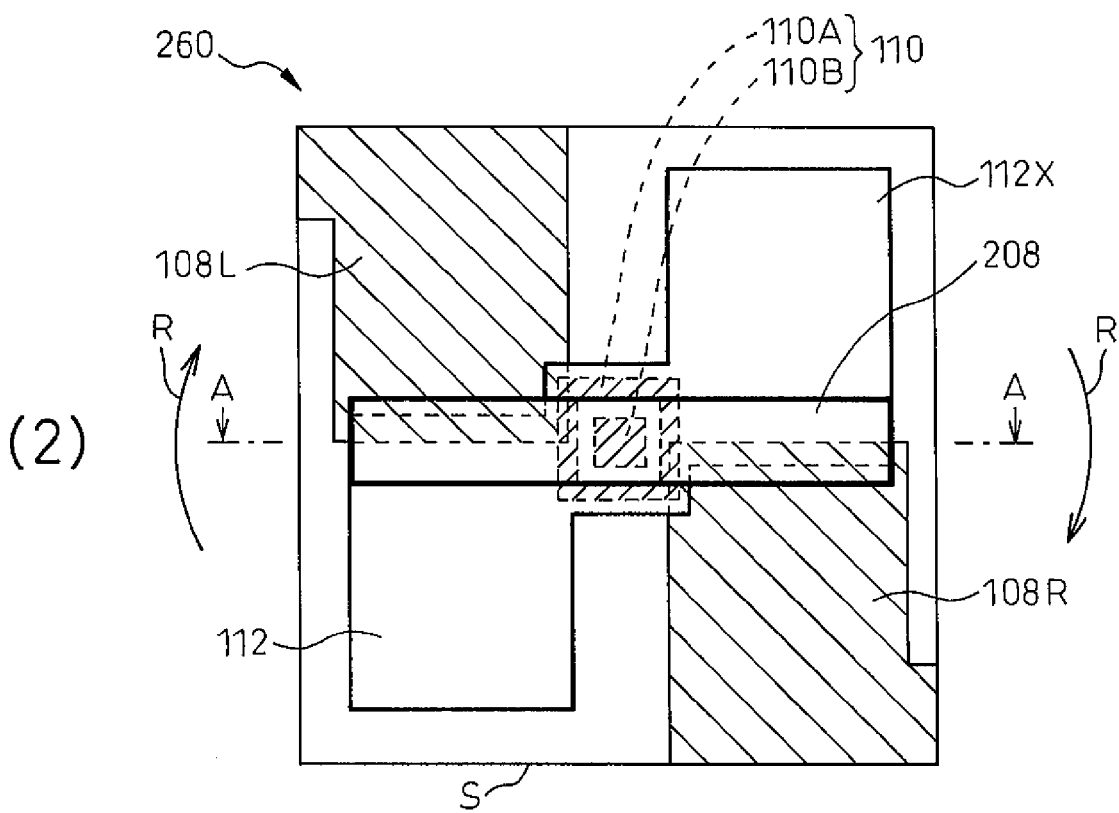
(2)

Fig. 23
(1)
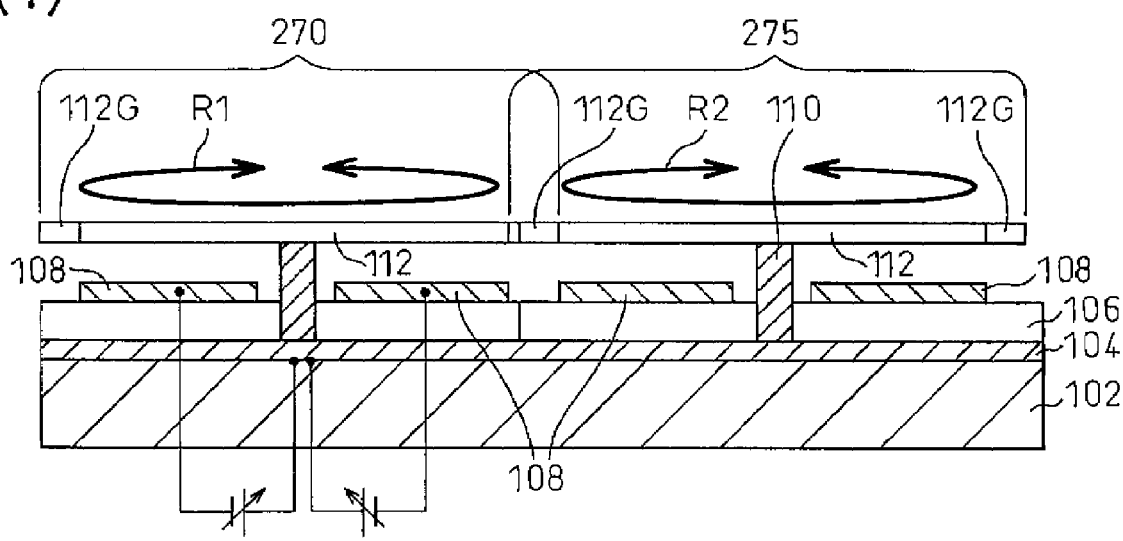
(2)
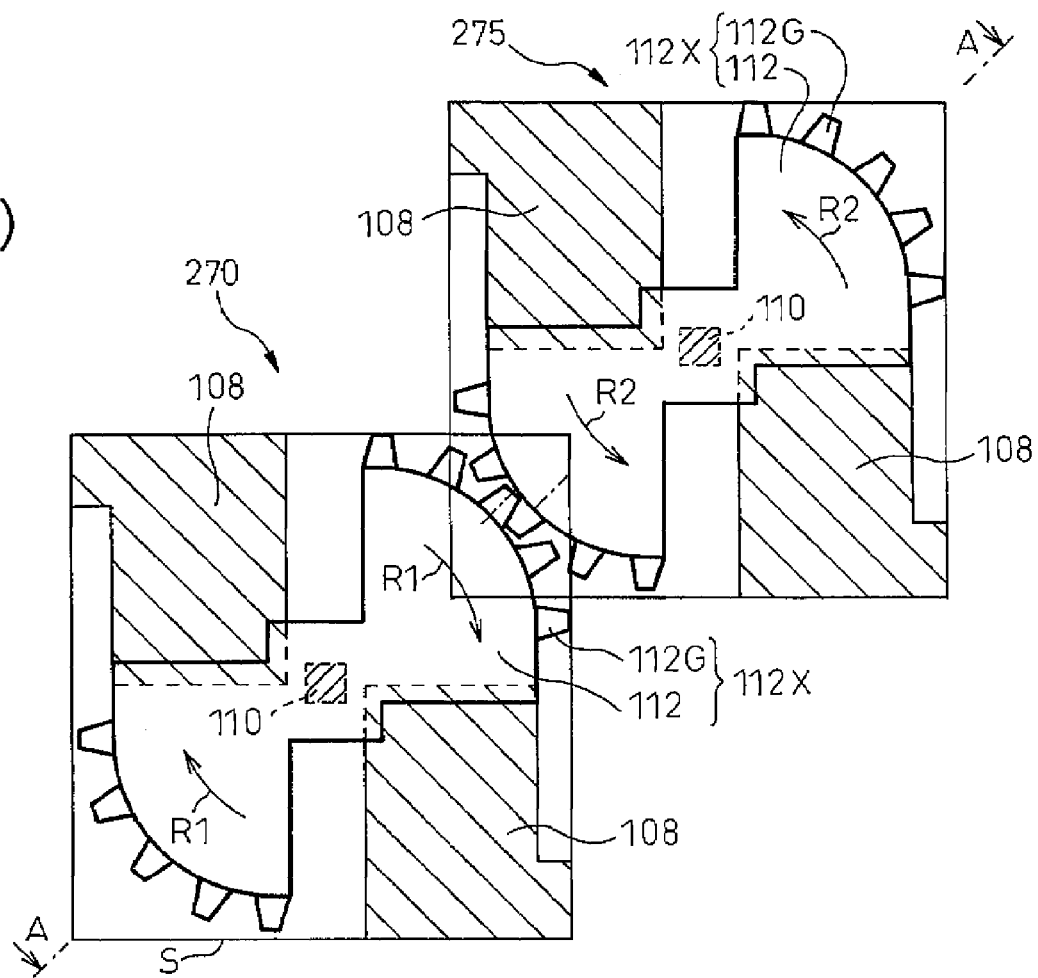

Fig. 25
(1)
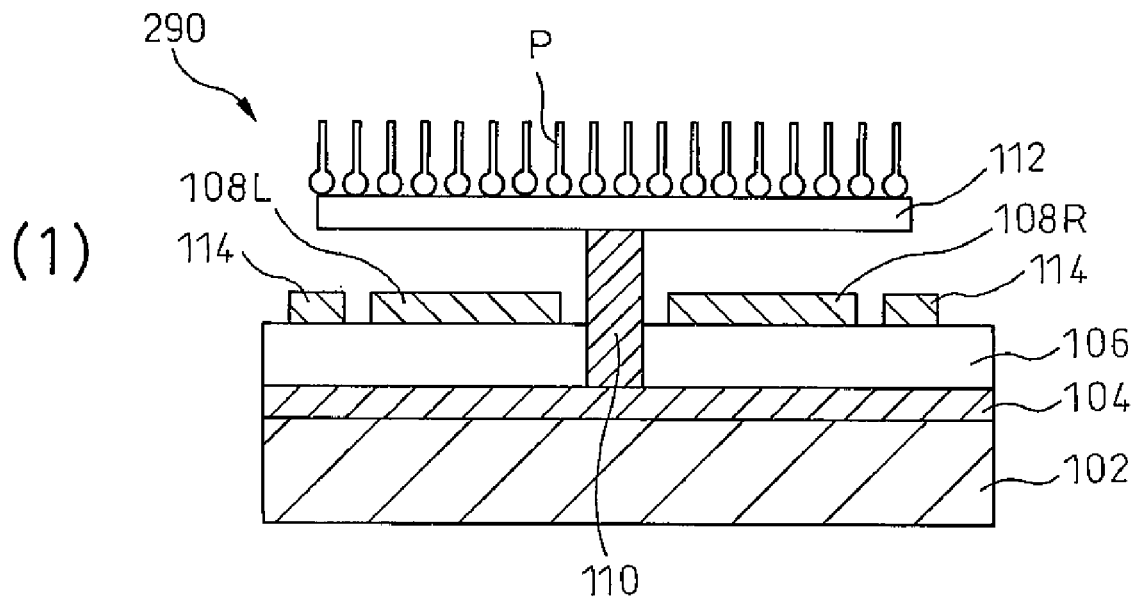
(2)
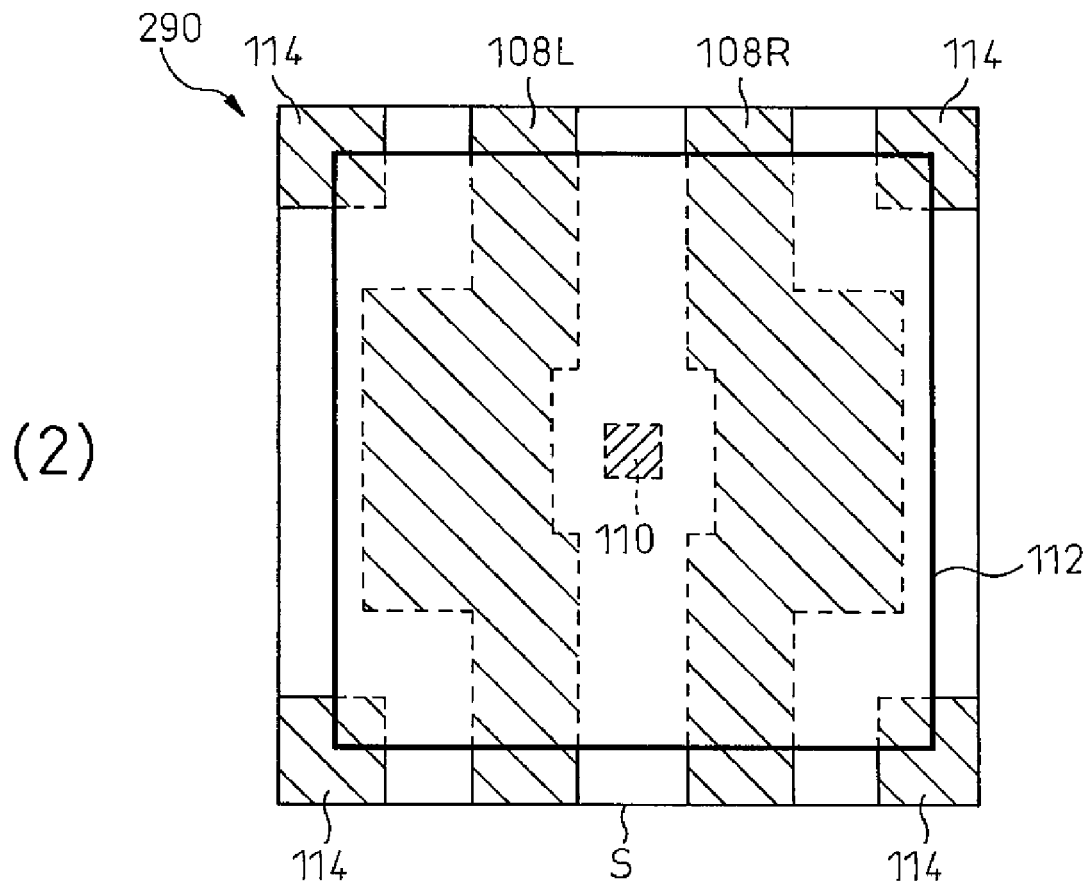

MOVABLE DEVICE

CROSS REFERENCE TO RELATED APPLICATIONS

This application is a Continuation of International Application No. PCT/JP2006/306270, with an international filing date of Mar. 28, 2006, which designating the United States of America, the entire contents of which are incorporated herein by reference.

TECHNICAL FIELD

The present invention relates to a movable device simultaneously enabling reduction of the size, increase of the operating speed, streamlining of the production process, reduction of cost, and improvement of the reliability of an optical device etc. made by a conventional MEMS (Micro Electro Mechanical System).

The movable device of the present invention can be applied advantageously as a movable device for an optical device (reflection mirror, light shutter, variable optical rotary device, variable condensing mirror, electrical switch (complete ON/OFF), memory (volatile, nonvolatile, multivalue), sensor (acceleration, angular acceleration, and mass), etc. (variable capacity capacitor, movable antenna, and vibration motor).

BACKGROUND ART

An optical device using a conventional MEMS (below, "optical MEMS") is shown in FIG. 1 (Fujita Hiroyuki, "Micro Nanomachine Technology Primer", p. 174 (Kogyo Chosaikai Publishing, Aug. 15, 2003)). The illustrated reflection mirror device 10 is a reflection mirror layer L1 provided with a reflection mirror 12, a tiltable layer L2 having a tilt plate 18 tiltably joined to a base 14 through a torsion spring 16, a fixed layer L3 including a base 22 and bottom electrode 24, and a layer L4 of a CMOS memory, that is, a total of four layers. When the mirror 12 of the layer L1 engages with the tilt plate 18 of the layer L2 and voltage is applied between the tilt plate 18 of the layer L2 and the bottom electrode 24 of the layer L3, the Coulomb force acting between the tilt plate 18/bottom electrode 24 causes the tilt plate 18 of the layer L2 to tilt and the reflection mirror 12 engaged with the tilt plate 18 to tilt together with it. The CMOS memory of the layer L4 stores the operating state due to the above tilt. When the application of voltage between the tilt plate 18/bottom electrode 24 is stopped, the elasticity of the torsion spring 16 causes the mirror 12 to return to the posture before tilt together with the tilt plate 18.

In the optical MEMS 10 serving as this reflection mirror device, for projector use (image projection use), one mirror 12 forms one pixel. The mirror 12 has a size of 25 µm×25 µm or so or remarkably larger compared with the size of patterns of an LSI (less than several µm). Corresponding to the mirror size, the structure of the optical MEMS 10 as a whole also becomes large. The result is a complicated structure where a large number of members are engaged with each other over four layers. The production process also becomes troublesome.

On top of this, the torsion spring enabling tilt/return of the mirror 12 is made of metal which becomes fatigued and easily breaks upon repeated torsional deformation, so is low in reliability.

The operating speed of the mirror 12 need only be one enabling video viewed by a person to be displayed, so is a slow 1 kHz to 1 MHz or so. In particular, for use as a modulator for high speed communications etc., operation at several 10 MHz to several GHz is necessary. Compared with this, the speed is 1 to 6 orders slower. An optical MEMS is promising not as a video device, but as an optical modulator for optical communications between chips or between boards. The operating frequency of the optical MEMS is determined by the resonance frequency of the structure, so to increase the operating speed, it is necessary to make the size smaller to increase the resonance frequency. To make the size smaller, the structure has to be made simpler and production facilitated. Further, as the operating frequency becomes higher, the number of times of repeated operations also remarkably increases, so it is necessary to improve the fatigue strength to increase the reliability.

As another application of an MEMS, application to a switch may also be expected. In recent years, usage of high frequencies such as by mobile phones, the Internet, Bluetooth, etc. has remarkably grown. The conventional frequency bands are becoming overly congested. Therefore, there has been a shift to the higher frequency regions. With high frequency circuits or RF circuits, the interference between circuits (parasitic capacitance and parasitic resistance) has to be eliminated as much as possible, so current transistors which only switch between a low resistance state and high resistance state between ON/OFF are insufficient. Rather, the old "switches" which completely cut or connected circuits—which were most prevalent before the appearance of transistors—are desirable since they can reduce the parasitic capacitance or parasitic resistance down to the ideal state.

However, as such a switch, mounting together with an LSI enabling complicated circuits to be realized at a high density is demanded. Up until now, there have been MEMS's mounted together with LSIs, but these have been large in size, low in operating speed, and large in power consumption, so complete integration with LSI's has not been achieved. Therefore, ultramicro switches able to be completely mounted together with LSI's have been desired.

As still another application of MEMS's, application to memories is promising. With memories, the increasing definition and speed of image processing has led to demands for new development of more inexpensive, larger capacity nonvolatile memories.

As another application of MEMS's, sensors are also promising. To realize greater safety, security, and comfort in all sorts of areas of human life such as electrical products, automobiles, and robots, various types of sensors are spreading in use. As a future trend, the types and numbers of sensors utilized are also expected to increase. It is expected that "smart sensors" able to immediately make complicated judgments by combination with LSIs will become the mainstream. A large variety of sensors can be selectively produced by a single production process. Development of extremely fine sensors able to be fully mounted with LSI's is therefore desired.

In addition, as modes of application of MEMS able to be integrally mounted with LSIs, variable capacity capacitors, variable direction directional antennas, drive devices (motors), power transmission mechanisms, etc. may also be expected.

Most conventional MEMS's are being produced by processing Si semiconductor monocrystalline substrates. Competition arises for substrate space with the LSI circuits fabricated in the same monocrystalline substrate, so the degree of integration has been hard to improve. Further, the process of production of MEMS's and the process of production of LSIs interfere with each other in temperature and formation of step differences, so the performances of the two deteriorate.

In particular, in LSI devices mounting conventional MEMS's, to secure the mechanical strength of moving parts of MEMS's, since the parts are built into the monocrystalline semiconductor substrate, production of the MEMS's has also had to be started from the initial stage of the LSI production process. As a result, MEMS's produced at parts of semiconductor substrates have been exposed to the high temperature heat treatments required for LSI production and have unavoidably deteriorated in characteristics.

To avoid this, it has been necessary to change the process of production of LSIs so that such interference does not occur. The precious library of LSI production technology built up through long experience cannot be effectively utilized and costs rise due to the expenses for development of new processes.

Ideally, if it were possible to form various MEMS's suitable for the above various applications by a low temperature process on a semiconductor substrate on which LSI circuits were completed without having any effect on the LSI characteristics, it would be possible to effectively utilize the huge conventional library of LSI production technology, so no new development costs would be required. Simultaneously, higher integration could be realized by the two-story structure of an MEMS provided on top of LSI interconnects. Overall higher functions could be expected to be realized as LSI devices with built-in MEMS's.

As explained above, conventional MEMS's are complicated in structure and cannot be reduced in size, so have the problems that they are slow in operating speeds, troublesome in production processes, and unavoidably high in costs and, further, are low in fatigue strength of the moving parts, so are low in reliability.

Note that Japanese Patent Publication (A) No. 2002-526354 proposes a process for production of carbon nanotubes as mechanical elements of MEMS devices.

However, this only shows using a carbon nanotube to form a probe with a cantilever front end utilizing the microsize of the carbon nanotube. It does not suggest at all a movable device provided with an electrode structure or a moving part comprised of a carbon nanotube.

Further, Japanese Patent Publication (A) No. 2005-520450 proposes a micromirror package using an MEMS. A MEMS mirror facing a pad on a semiconductor chip is disclosed, but this is just a simple improvement of a package. A mirror device using a carbon nanotube for the moving part of an MEMS mirror is not suggested at all.

SUMMARY

According to a first aspect of the present invention, there is provided a movable device provided with bottom electrodes and a basic conductive layer fixed to a substrate, an elastic shaft of a carbon nanotube with a bottom end fixed on the basic conductive layer and standing up, and a top structure including a top electrode spaced away from the bottom electrode and fixed to a top end of the elastic shaft, wherein when applying voltage between a bottom electrode and the top electrode, the top electrode displaces relative to the bottom electrodes within an allowable range of elastic deformation of the elastic shaft due to the Coulomb force acting between two electrodes.

Further, according to a second aspect of the present invention, there is provided a movable device provided with the basic structure according to the above first aspect wherein (1) when the top structure displaces relative to the bottom electrode in an allowable range of elastic deformation of the carbon nanotube, acceleration at that time is output as a change of electrostatic capacity between the two electrodes due to the displacement to thereby form an acceleration sensor and (2) an external mass applied to the top electrode is output as a change of resonance frequency of vibrational displacement of the top electrode with respect to the bottom electrode in an allowable range of elastic deformation of the carbon nanotube to thereby form a mass sensor.

BRIEF DESCRIPTION OF THE DRAWINGS

FIG. 4 are longitudinal cross-sectional views of a reflection mirror device using a tilt type movable device of the present invention;

FIG. 9 are plan views showing a multimirror structure arranging reflection mirror devices of the present invention in a matrix;

FIGS. 11(1) and (2) are (1) a longitudinal cross-sectional view and (2) a plan view of a light shutter device using a rotary type movable device of the present invention;

FIGS. 15(1) and (2) are (1) a longitudinal cross-sectional view and (2) a plan view showing a flexing type reflection mirror device of the present invention using a large number of carbon nanotube elastic shafts;

FIGS. 18(1) and (2) are (1) a longitudinal cross-sectional view and (2) a plan view of a switch or memory using a flexing type movable device of the present invention using a plurality of carbon nanotube elastic shafts;

FIGS. 21(1) and (2) are (1) a longitudinal cross-sectional view and (2) a plan view of a variable capacity capacitor using a flexing type movable device of the present invention;

FIGS. 22(1) and (2) are (1) a longitudinal cross-sectional view and (2) a plan view of a movable antenna using a rotary type movable device of the present invention;

FIGS. 23(1) and (2) are (1) a longitudinal cross-sectional view and (2) a plan view showing a rotary motor using a rotary type movable device of the present invention and a driven device gear meshed with the same;

FIGS. 25(1) and (2) are (1) a longitudinal cross-sectional view and (2) a plan view showing a mass sensor using a tilt type movable device of the present invention.

DETAILED DESCRIPTION OF THE PREFERRED EMBODIMENTS

Figure 1:
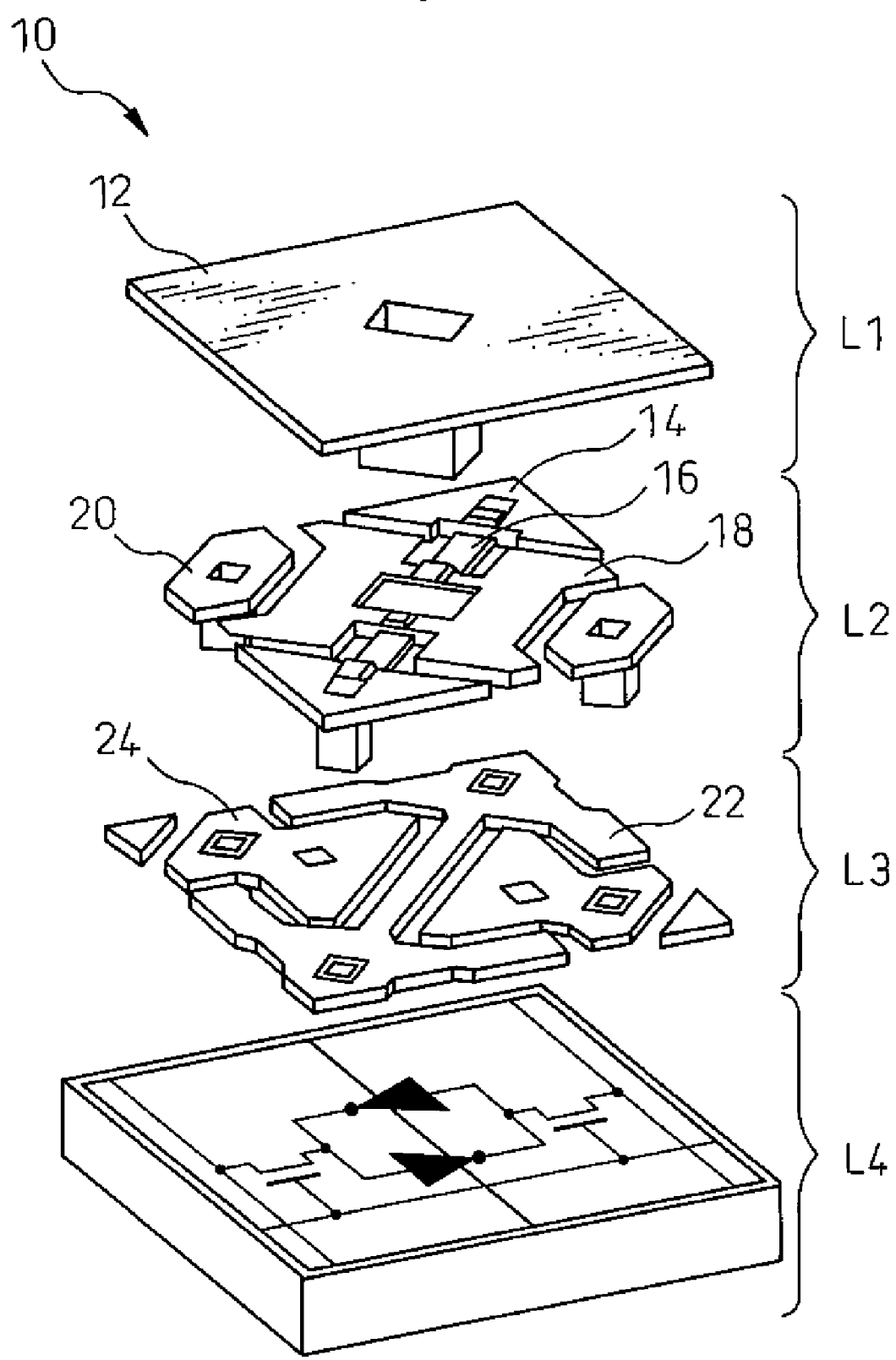
FIG. 1 is a perspective view showing a typical example of an optical device using a conventional MEMS (optical MEMS)
Figure 2:
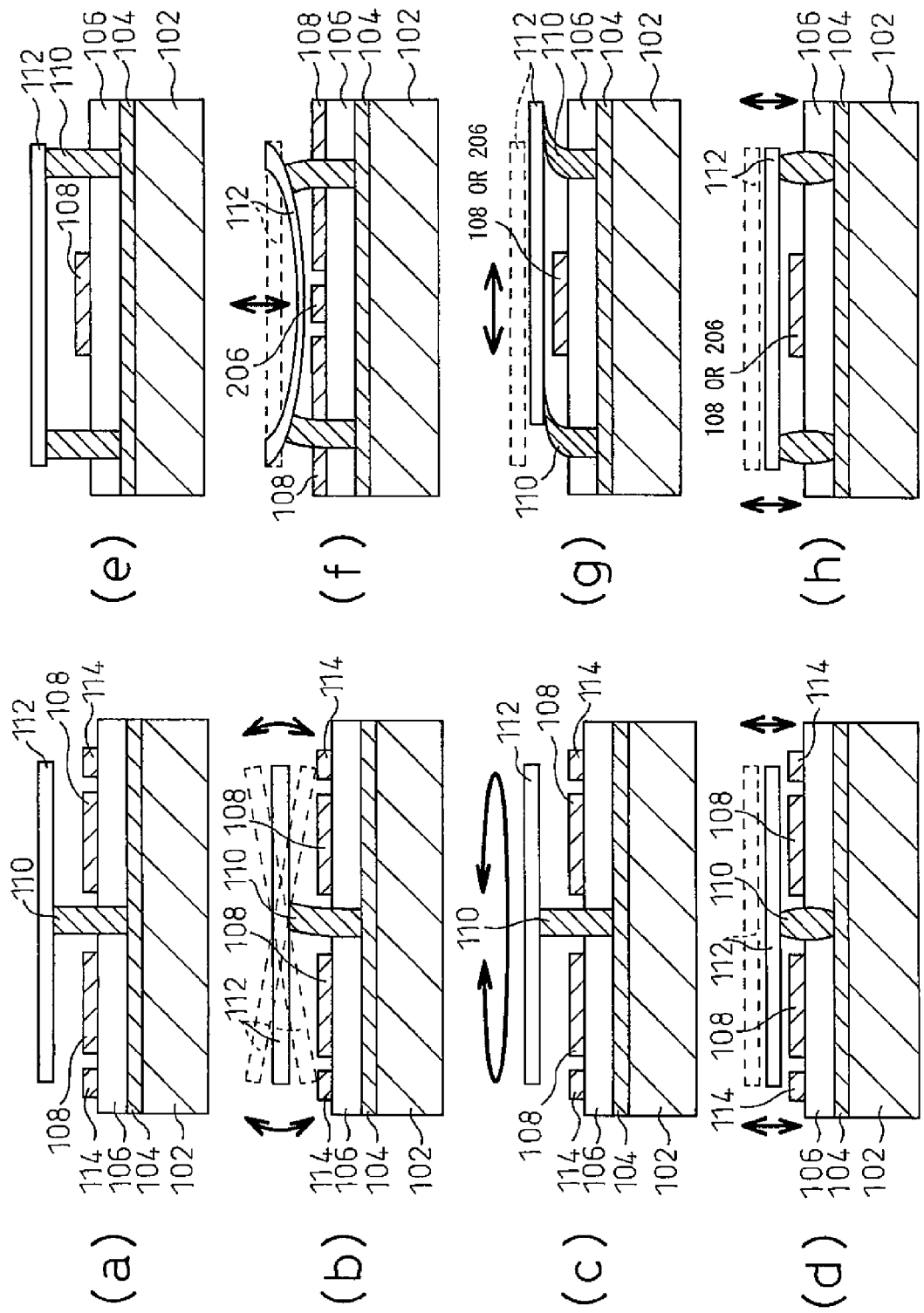
FIGS. 2(a) to (h) are cross-sectional views showing all together variations in the mode of deformation of a carbon nanotube elastic shaft of a movable device according to the present invention and mode of deformation of a top electrode.

As the modes of movable devices of the present invention, the representative ones are optical devices, electrical switches, memories, variable capacitors, movable antennas, motors, and sensors. These device modes are combinations of modes of elastic deformation of carbon nanotube elastic shafts and modes of displacement of the top electrodes. That is, there are the variations of (1) displacement of the top electrode by tilt, flexure, or horizontal movement due to the elastic bending deformation of a carbon nanotube elastic shaft, (2) displacement of the top electrode by rotation due to the elastic torsional deformation of a carbon nanotube elastic shaft, and (3) displacement of the top electrode by vertical movement due to elastic expansion/contraction deformation of a carbon nanotube elastic shaft. There are three modes of deformation of the carbon nanotube elastic shaft and five modes of displacement of the top electrode. Referring to FIG. 2, these variations will be explained. Note that FIGS. 2(*a*) to (*d*) show examples of use of a single carbon nanotube elastic shaft 110, while FIGS. 2(*e*) to (*h*) show examples of use of a plurality of carbon nanotube elastic shafts 110.

First, cases of a single carbon nanotube elastic shaft 110 will be explained.

FIG. 2(*a*) shows a movable terminal in the initial state before operation. In the illustrated example, a substrate 102 has a basic conductive layer 104, an insulation layer 106, and bottom electrode layers 108 stacked on it. A single carbon nanotube elastic shaft 110 is fixed at its bottom end to the basic conductive layer 104, passes through the insulation layer 106 to stand upright, and is fixed at its top end to a center of a top electrode 112. Stopper layers 114 on the insulation layer 106 prevent short-circuiting due to contact with the bottom electrodes 108 in the case of a mode where the top electrode 112 tilts.

In the mode shown in FIG. 2(*b*), as one example, the substantive part of a top electrode 112 and substantive parts of bottom electrodes 108 are arranged to overlap in a plan view. If applying voltage to either the left or right bottom electrode 108, the substantive part of the top electrode 112 at the side overlapping with the bottom electrode 108 of the voltage application side 2 is pulled downward by the Coulomb force whereby the top electrode 112 as a whole tilts to the voltage application side. At that time, the carbon nanotube elastic shaft 110 supporting the center of the top electrode 112 elastically deforms by bending to the tilt side.

In the mode shown in FIG. 2(*c*), as one example, the substantive part of a top electrode 112 and substantive parts of bottom electrodes 108 are arranged so as not to overlap at all or almost at all in a plan view. If applying voltage to both the left and right bottom electrodes 108, the top electrode 112 rotates about the carbon nanotube elastic shaft 110 so that its substantive part overlaps the substantive parts of the bottom electrodes 108. At that time, the carbon nanotube elastic shaft 110 supporting the center of the top electrode 112 elastically deforms by torsion.

In the mode shown in FIG. 2(*d*), as one example, a substantive part of a top electrode 112 and substantive parts of bottom electrodes 108 are arranged to overlap in a plan view. If applying voltage to both the left and right bottom electrodes 108, the top electrode 112 is pulled downward by the Coulomb force and descends as a whole. At that time, the carbon nanotube elastic shaft 110 supporting the center of the top electrode 112 elastically deforms by compression.

Next, cases of a plurality of carbon nanotube elastic shafts 110 will be explained.

FIG. 2(*e*) shows a movable terminal in the initial state before operation. In the illustrated example, a substrate 102 has a basic conductive layer 104, insulation layer 106, bottom electrode layer 108, and/or counter electrode 206 stacked on it. Four carbon nanotube elastic shafts 110 are fixed at their bottom ends to the basic conductive layer 104, pass through the insulation layer 106 to stand up, and are fixed at their top ends to the four corners of the top electrode 112.

In the mode shown in FIG. 2(*f*), as one example, if applying voltage between the bottom electrode 108 arranged right below the center part of the top electrode 112 and the top electrode 112, the center part of the top electrode 112 is pulled downward to flex and curve to a recessed shape. At that time, the carbon nanotube elastic shafts 110 supporting the four corners of the top electrode 112 elastically deform by bending toward the center part.

In the mode shown in FIG. 2(*g*), as one example, a top electrode 112 has an opening at its center part and forms substantive parts at its left and right. The bottom electrode 108 is arranged directly below the above opening so that the substantive parts of the top and bottom electrodes do not overlap in a plan view. Further, if applying voltage between the top and bottom electrodes, the top electrode 112 moves horizontally so as to overlap the bottom electrode 108. At that time, the carbon nanotube elastic shafts 110 supporting the four corners of the top electrode 112 elastically deform by bending in the direction of the above horizontal movement.

In the mode shown in FIG. 2(*h*), as one example, if applying voltage between the bottom electrode 108 arranged right below the center part of the top electrode 112 and the top electrode 112, the top electrode 112 as a whole descends. At that time, the carbon nanotube elastic shafts 110 supporting the four corners of the top electrode 112 elastically deform by compression.

The above modes were explained as modes where application of voltage caused the top electrode to actively displace, but there are also modes where voltage is not applied, but for example acceleration is used and the top electrode passively changes.

Figure 3:
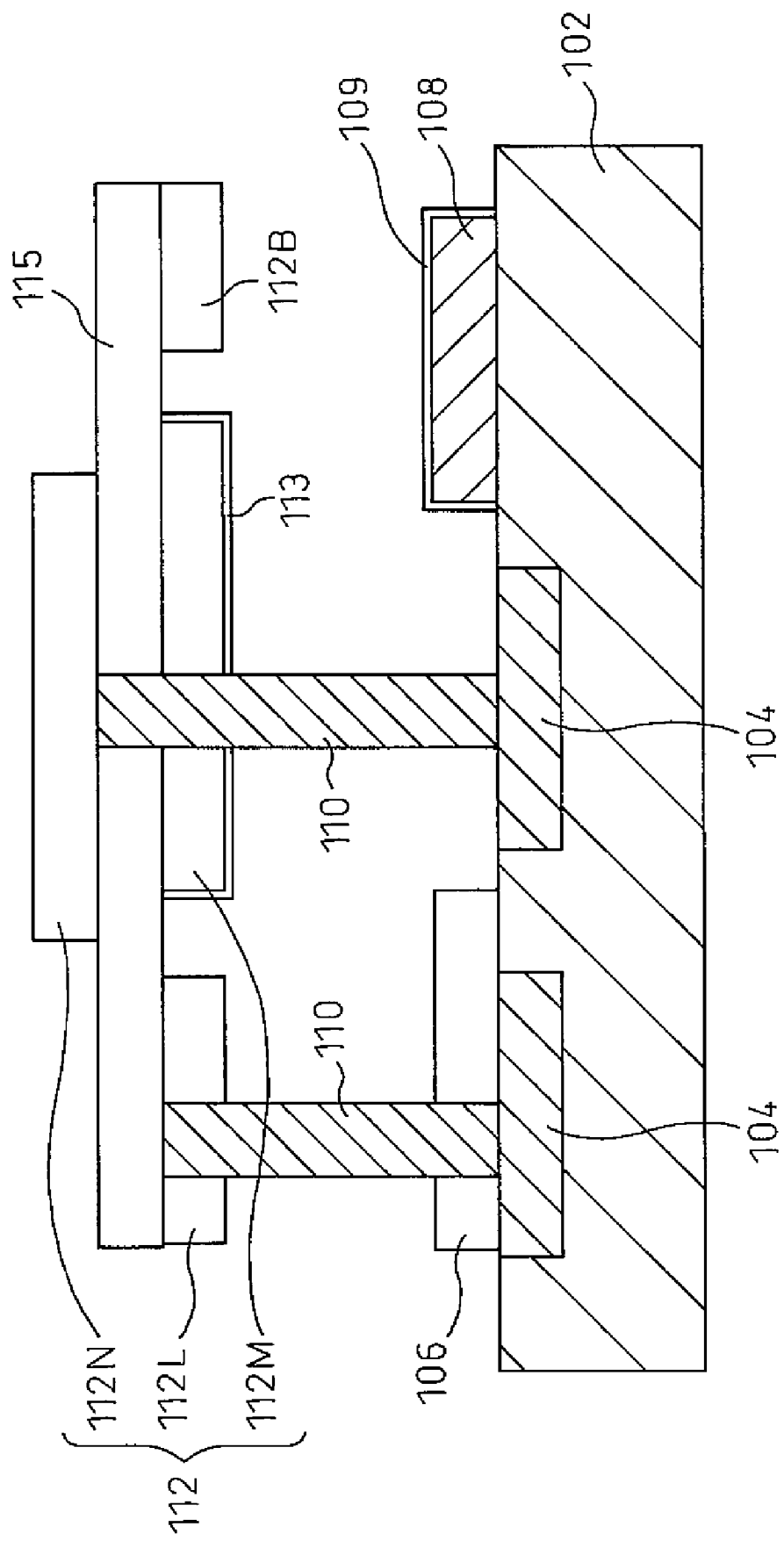
FIG. 3 is a cross-sectional view showing all together various modes of the structure of a movable device according to the present invention.

Further, the structure of the movable device of the present invention is not limited to the basic mode explained above. As shown in FIG. 3, various modes are possible. Note that FIG. 3 shows a plurality of different modes all together.

Basic conductive layers 104 provided in a substrate 102 have carbon nanotube elastic shafts 110 fixed to them at their bottom ends and standing up. The parts where the basic conductive layers 104 and the bottom ends of the carbon nanotube elastic shaft 110 are fixed may be reinforced by insulation layers 106 etc. in accordance with need.

Top electrodes 112 are fixed to the top ends of the carbon nanotube elastic shafts. An insulator or other support 115 separate from the top electrodes 112 may also be fixed to the top ends of the carbon nanotube elastic shafts 110. In this case, the top electrodes 112 may be directly fixed to the carbon nanotube elastic shafts 110 or may be fixed through the support 115 indirectly to the carbon nanotube elastic shafts 110. Furthermore, in this case, the top electrodes 112 may be provided at the bottom surface of the support 115 such as with 112L and 112M or provided at the top surface of the support 115 such as with 112N.

It is possible to provide a terminal (or electrode) like the movable terminal 112B which is not connected to any carbon nanotube elastic shaft 110. Note that in the illustrated example, the movable terminal 112B is provided at the support 115 separate from the top electrodes 112, but it is also possible to provide it at a top electrode 112 via an insulation layer. Furthermore, in the illustrated example, the movable terminal 112B is provided at the bottom surface of the support 115, but it is also possible to provide it at the top surface and/or bottom surface of the support 115 or a top electrode 112.

When the top electrodes 112 and bottom electrodes 108 do not require electrical connection functions, their surfaces may be covered by insulation films 113 and 109.

Only one bottom electrode 108 is shown, but a plurality may be provided in accordance with need.

The carbon nanotube elastic shafts 110, as explained above, are sometimes single shafts and sometimes pluralities of shafts.

The carbon nanotube elastic shafts 110 may be provided with both a mechanical support function and conductive function or may be provided with either function. The carbon nanotube elastic shafts 110 may also be bundles of a plurality of carbon nanotubes with different potentials. The carbon nanotube elastic shafts 110 may be shaft shaped, wall shaped, hollow shaped, solid shaped, etc.

Below, the present invention will be explained in further detail by embodiments with reference to the attached drawings.

EMBODIMENTS

Embodiment 1

Reflection Mirror Device

FIG. 4(1) is a longitudinal cross-sectional view of a reflection mirror device of an optical MEMS using a movable device of the present invention.

The illustrated reflection mirror device 100 is comprised of a substrate 102 on which a basic conductive layer 104, insulation layer 106, and a pair of left and right bottom electrodes 108L and 108R are formed in that order. A carbon nanotube elastic shaft 110 is fixed at its bottom end to the basic conductive layer 104 and passes upward through the insulation layer 106 to stand up. The top end of this elastic shaft 110 has the top electrode 112 fixed to it. The top surface of the top electrode 112 forms a mirror surface which functions as a reflection mirror. The insulation layer 106 has the function of reinforcing the joint between the bottom end of the carbon nanotube 110 and the basic conductive layer 104 so as to enable the superior mechanical properties of the carbon nanotube to be fully exhibited. Due to this, the carbon nanotube 110 is constrained from its circumference inside the insulation layer 106 and will not substantively deform there. Only the part above the insulation layer 106 will deform.

The carbon nanotube has an extremely high tensile strength of five times that of steel and is monocrystalline, so compared with a polycrystalline or amorphous substance, is higher in fatigue strength upon repeated deformation. Further, the allowable current density reaches as much as 1000 times that of copper and the thermal conductivity is 10 times that of copper. By using a carbon nanotube provided with such mechanical, electrical, and thermal characteristics to form a moving part constituted by the elastic shaft 110, it is possible to realize a moving part of an extremely simple structure and simultaneously obtain a function as a flexible interconnect for electrical connection with the top electrode, so mechanical and electrical reliability can be simultaneously obtained.

The carbon nanotube elastic shaft 110 may be a single carbon nanotube, but a composite of a large number of carbon nanotubes bundled together is advantageous. Due to this, the mechanical strength of the elastic shaft 110 as a whole rises and simultaneously the flexible deformation of the individual carbon nanotubes forming the bundle is sufficiently maintained, so flexible deformation is possible for the elastic shaft as a whole.

As a typical example of the size of the reflection mirror device 100, the dimensions (μm) of the parts are shown in the figure.

Figure 5:
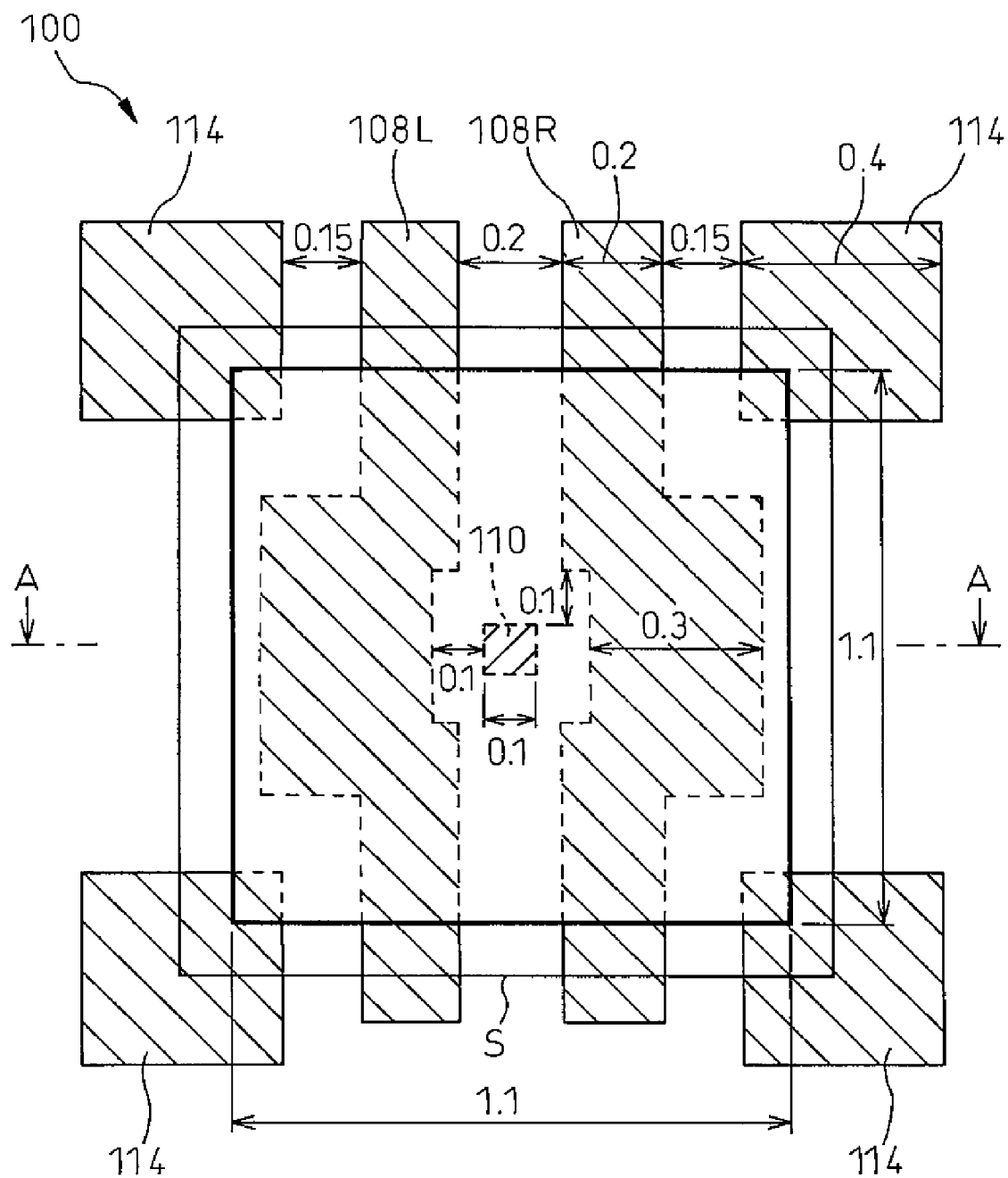
FIG. 5 is a plan view of the reflection mirror device of FIG. 4 seen from above.

FIG. 5 is a plan view of the reflection mirror device 100 as seen from above the substrate. Examples of the dimensions (μm) corresponding to FIG. 4 are entered. The fine line frame S shows the region which one mirror occupies when arranging a later explained multimirror and shows the boundary lines with four adjoining mirrors.

The reflection mirror device 100 is comprised of a columnar shaped carbon nanotube elastic shaft 110 having a square shape cross-section around which are arranged, at symmetric positions at the two left and right sides, bottom electrodes 108L and 108R and at the four corners further outside of which are arranged stopper layers 114. The square shaped top electrode 112 is fixed at the bottom surface of its center to the top end of the carbon nanotube elastic shaft 110. The four corners of the square shape of the top electrode 112 are positioned above the innermost corner parts of the square shaped stopper layers 114.

Figure 6:
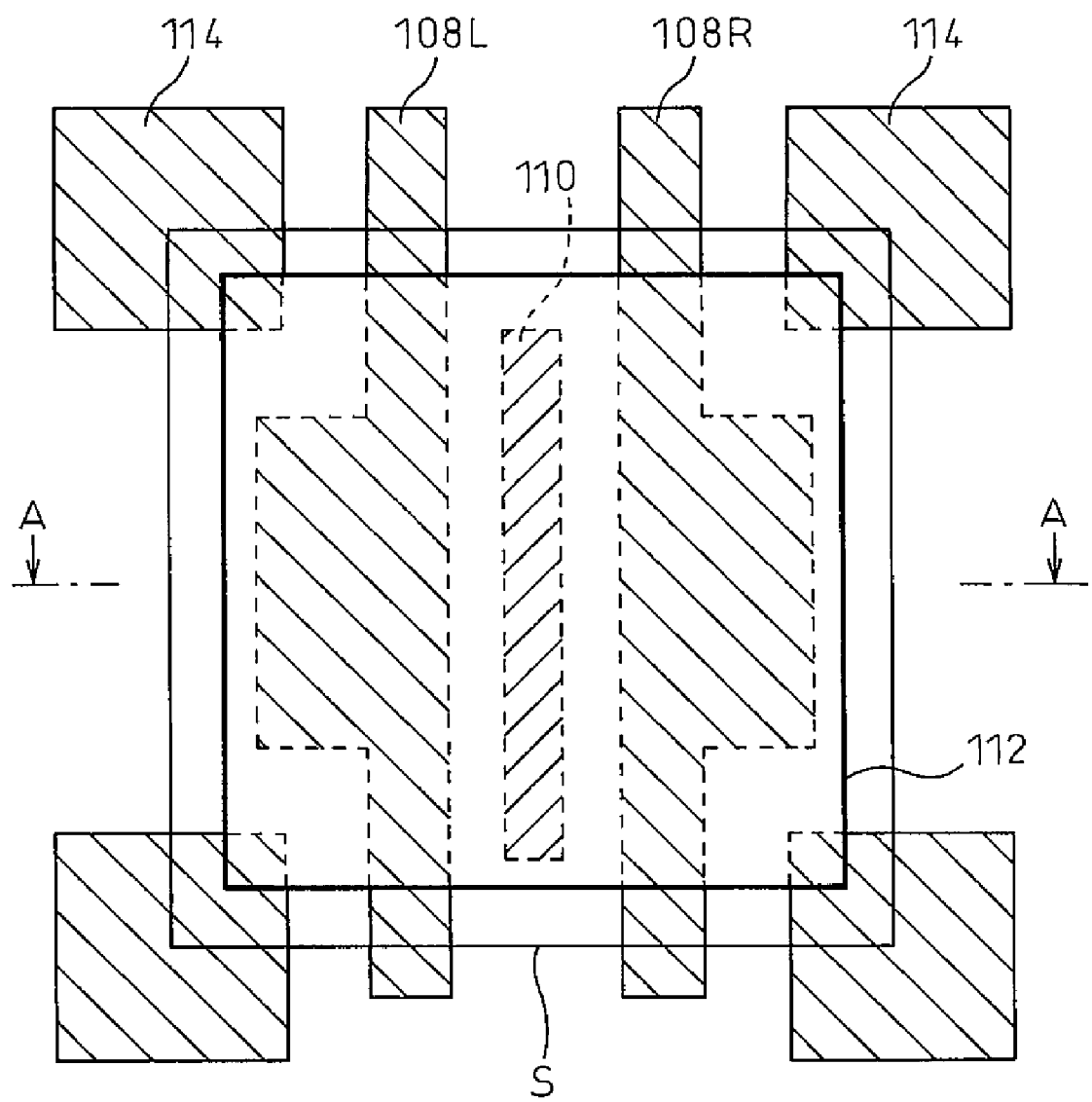
FIG. 6 is a plan view of another mode of the reflection mirror device of FIG. 4 seen from above.

The carbon nanotube elastic shaft 110 need not be columnar such as shown in FIG. 5 and may also be wall shaped as in FIG. 6. Further, the cross-sectional shape need not be square shaped or rectangular shaped and may also be polygonal shaped, circular shaped, elliptical shaped, or otherwise shaped. Further, the shape of the reflection mirror (top electrode 112 etc.) need not be particularly limited and may also be a square shape, rectangular shape, polygonal shape, circular shape, elliptical shape, or other shape.

FIG. 4(1) is a cross-sectional view along the line A-A of FIG. 5 or FIG. 6. Originally, the stopper layers 114 of FIG. 5 do not appear in FIG. 4(1), but are shown in FIGS. 4(1) to (3) for convenience of explanation.

The reflection mirror device 100 of the present invention operates as follows.

In FIG. 4(1), among the bottom electrodes 108 at the two sides of the carbon nanotube elastic shaft 110, for example, the right side bottom electrode 108R is connected through a not shown interconnect to one polarity side of the power source. The top electrode 112 is connected through the basic conductive layer 104 and the carbon nanotube elastic shaft 110 to the other polarity side of the power source. By doing this, voltage is applied between the right side bottom electrode 108R and the top electrode 112.

Due to this, as shown in FIG. 4(2), the right side bottom electrode 108R and the top electrode 112 sandwich the space between them to form a capacitor. By the two electrodes being charged to opposite polarities, a Coulomb force Q is generated. Pulled by this, the top electrode 112 tilts to the right by the elastic bending deformation of the carbon nanotube elastic shaft 110. The right end of the top electrode 112 strikes the right side stopper layers 114 and stops in that state. Due to this, the occurrence of overcurrent due to contact (short-circuit) between the top electrode 112 and the bottom electrode 108R is avoided.

If applying voltage between not the right side bottom electrode 108R, but the left side bottom electrode 108L and top electrode 112, as shown in FIG. 4(3), the left side bottom electrode 108L and the top electrode 112 are pulled together by the Coulomb force Q. The top electrode 112 tilts to the left due to the elastic deformation of the carbon nanotube elastic shaft 110. The left end of the top electrode 112 strikes the right side stopper layers 114 and stops in that state. Due to this, the occurrence of overcurrent due to contact (short-circuit) between the top electrode 112 and the bottom electrode 108L is avoided.

Contact between the tilted top electrode 112 and bottom electrodes 108R, 108L can be prevented without providing the stoppers 114 if forming an insulating film at the contact parts of at least one of the top and bottom electrodes. However, formation of an insulating film necessitates the addition of a new step. Provision of the stoppers 114 able to be formed in the same step as the bottom electrodes 108R, 108L is advantageous in this point. Further, keeping the height of the movable device to a minimum is preferable from the viewpoint of reduction of size etc. The presence of an insulating film increasing the distance between the top and bottom electrodes (movable device height) is not preferable from this viewpoint. In that sense, the insulating film is preferably formed as thin as possible, but if made too thin, there is a concern that the large number of times the electrodes contact each other will result in wear and loss of the insulation function.

If stopping the application of voltage in the tilted state of the above FIGS. 4(2) and (3), the Coulomb force no longer acts, so the top electrode 112 returns to the horizontal state of FIG. 4(1) due to the elasticity of the carbon nanotube elastic shaft 110.

By having the top electrode 112 serving as a reflection mirror take the three states shown in FIG. 4, that is, (1) horizontal, (2) right tilted, and (3) left tilted in this way, the incident light can be reflected in three directions.

The reflection mirror device 100 has a size of substantially 1 µm×1 µm. Compared with a conventional DMD pixel of 20 to 30 µm×20 to 30 µm, the size can be reduced to less than a fraction of a percent of the former. This is a size equal to an LSI fabricated on a semiconductor substrate and enables mounting together with an LSI on the same substrate. The operating speed can be increased over the 1 kHz for conventional image projection use etc. to the several 10 MHz to several GHz or more required for a high speed communication use modulator.

Further, since the structure is simple, production is easy and inexpensive and, further, the operational reliability is high.

Furthermore, a carbon nanotube is monocrystalline, so is high in fatigue strength and superior in reliability over a long period.

Figure 7:
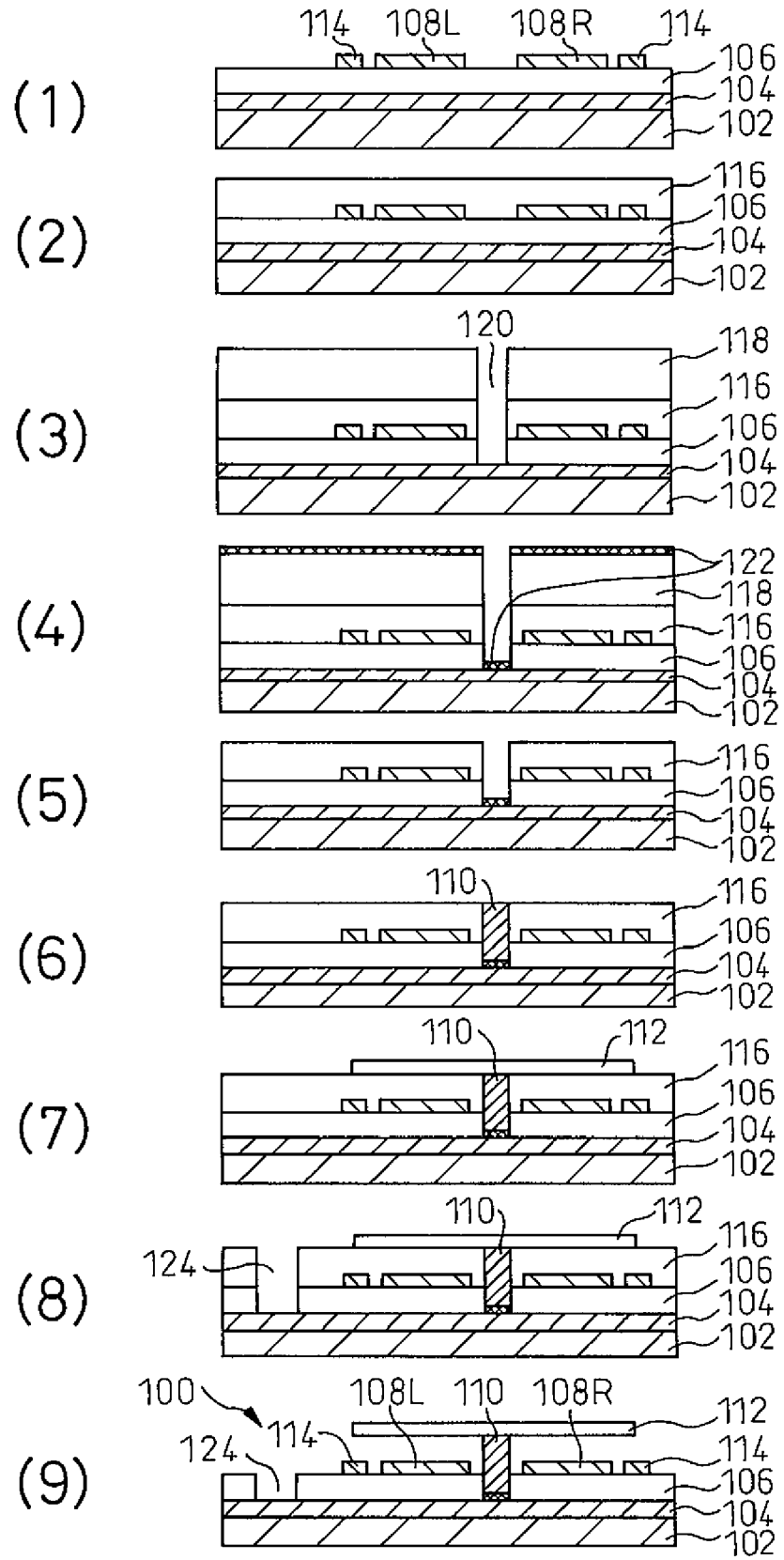
FIGS. 7(1) to (9) are cross-sectional views showing the steps production of the reflection mirror device shown in FIG. 4 and FIG. 5.

Referring to FIG. 7, a typical example of the production steps of an optical MEMS 100 will be explained.

First, as shown in FIG. 7(1), an Si semiconductor substrate 102 is processed by the sputtering method, plasma CVD method, vapor deposition method, CVD method, or other low temperature film-forming method to form a TiN basic conductive layer 104 and $Si_3N_4$ insulation layer 106. Furthermore, a TiN layer is formed and patterned to form bottom electrodes 108L, 108R and stopper layers 114. While not shown, the Si semiconductor substrate 102 may have an LSI circuit fabricated on it in advance.

Next, as shown in FIG. 7(2), the CVD method, spin coat method, etc. is used to form an LTO sacrificial film 116 over the entire surface.

Next, as shown in FIG. 7(3), the entire surface is formed with a resist pattern 118. This is used as a mask for processing by the RIE method, wet etching method, etc. to form an opening 120 reaching the TiN basic conductive layer 104.

Next, as shown in FIG. 7(4), the sputtering method, particle diffusion method, etc. is used to form a Co particle layer 122 over the entire surface.

Next, as shown in FIG. 7(5), a resist stripper, rusher, etc. is used to remove the resist layer 118 and the Co particle layer 122 together with it. Due to this, the Co particle layer 122 is left at only the top surface of the TiN basic conductive layer exposed in the opening 120.

Next, as shown in FIG. 7(6), the general CVD method, plasma CVD method, etc. is used to grow the carbon nanotube 110 from nucleii of carbon particles at the bottom of the opening 120 up to the level of the top surface of the sacrificial layer 116.

Next, as shown in FIG. 7(7), the top surface of the LTO sacrificial film 116 including the top end of the carbon nanotube 110 exposed from the top edge of the opening 120 is processed by the sputtering method, CVD method, vapor deposition method, etc. to form a layer of Al, Au, TiN, Pt, W, Ni, Ti, Co, Cu, Fe, etc., then is patterned to form the top electrode 112. The top surface of the top electrode 112 is preferably provided with an Al, Au, or other high reflectance layer.

Next, as shown in FIG. 7(8), the RIE method etc. is used to open a via hole 124 for connection with the TiN basic conductive layer 104.

Finally, as shown in FIG. 7(9), HF etc. is used to remove the LTO sacrificial film 116 to complete the optical MEMS 100 of FIG. 4(1). Note that when the Si semiconductor substrate 102 is formed with an LSI circuit in advance, it is possible to form the necessary interconnect layer between the optical MEMS in the middle of fabrication on the substrate 102 at a suitable step of the above steps (1) to (9) and the LSI circuit formed on the substrate 102.

In the above way, the optical MEMS 100 can be prepared by only the low temperature process, so even if the Si semiconductor substrate 102 has an LSI circuit fabricated on it in advance, the circuit will not be affected by the heat from the MEMS fabrication process. Further, it is possible to complete the LSI production process, then perform the MEMS fabrication process, so the high temperature processing used for the LSI production step has no influence on the MEMS, the massive library of conventional LSI production technology can be effectively utilized, and no cost occurs for development of new processes.

Embodiment 2

Multidirection Tilt

The reflection mirror device 100 of Embodiment 1 was shown in a mode tilting to the two directions of left and right, but the invention does not have to be limited to this. A mode tilting in larger directions is also possible.

Figure 8:
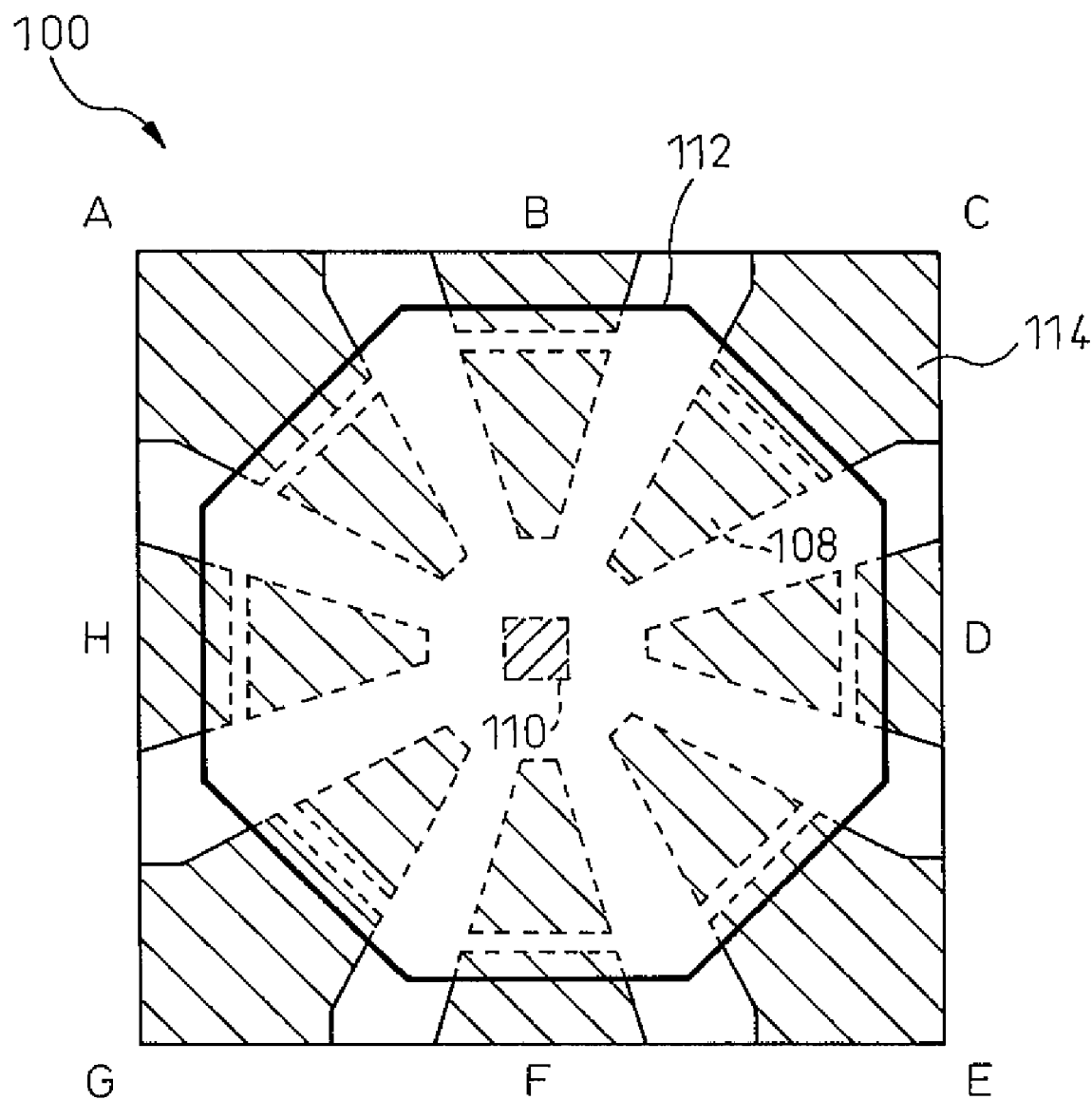
FIG. 8 is a plan view showing a reflection mirror device of the present invention tilting in multiple directions.

For example, as shown in FIG. 8, the bottom electrodes 108 and stopper layers 114 are arranged radially in eight directions A to H centered about the carbon nanotube elastic shaft 110. By applying voltage between any one direction bottom electrode 108 among A to H and the top electrode 112, the top electrode 112 tilts in the direction of the bottom electrode 108 to which the voltage is applied. In this way, a reflection mirror device able to selectively tilt in eight directions can be realized.

Embodiment 3

Multimirror

An example of a multimirror structure comprising reflection mirror devices 100 using the optical MEMS explained in Embodiment 1 arranged in a matrix will be explained.

The LSI device 126 shown in FIG. 9(1) is prepared by a multimirror structure shown in FIG. 9(2) using part of the connection pads 128 among a large number of connection pads 128, 130 as connection pads for optical communication. The other pads 130 are used for ordinary interconnect connections.

FIG. 9(2) is a plan view of a multimirror structure comprised of the MEMS reflection mirror devices 100 of Embodiment 1 arranged in a 5×5 matrix. The fine lines S show the outer edges of the regions occupied by the individual reflection mirror devices 100 and the boundary lines between adjoining mirror devices. If using reflection mirror devices 100 of the size of Embodiment 1, the areas of the pads 128 as a whole become 6.5×6.5 µm.

The optical communication pads 128 may be used for connecting a large number of LSI devices by optical signals. By configuring the individual pads 128 not by single mirror structures using single pad sized optical MEMS's, but by multimirror structures using small optical MEMS's 100, it is possible to greatly increase the operating speed. That is, for the same pad area, the operating speed of a small mirror forming the multimirror structure is much faster than the operating speed of a pad sized single mirror. By simultaneously operating the small mirrors 100 of the matrix as a whole, it is possible to transmit information of the same content as a single mirror by a far faster speed. For example, when the transmission speed is 1 MHz for a single mirror structure pad, use of the multimirror structure enables a higher speed of several 10 MHz to several GHz.

Further, as an ancillary advantage due to use of a multimirror, since the individual mirrors are small, the optical path differences between reflected light beams in the mirror area can be made sufficiently small compared with the wavelength, so it is possible to prevent attenuation due to interference.

When it is possible to output a high frequency signal from an LSI as an optical signal in this way, compared with the conventional practice of bringing pins into contact with the pads or welding metal wires etc. and outputting electrical signals, it is possible to greatly streamline the complicated interconnects between LSIs and, simultaneously, it is possible to prevent signal interconnect delays or occurrence of cross talk. Further, when necessary to connect from a single device to all sorts of other devices (neurocomputer etc.), if the total number of devices is N, the necessary total number of interconnects becomes N(N−1). Even if using multilayer interconnects, this is impossible in practice. However, it becomes possible if using light.

Embodiment 4

Optical Interconnect

Figure 10:
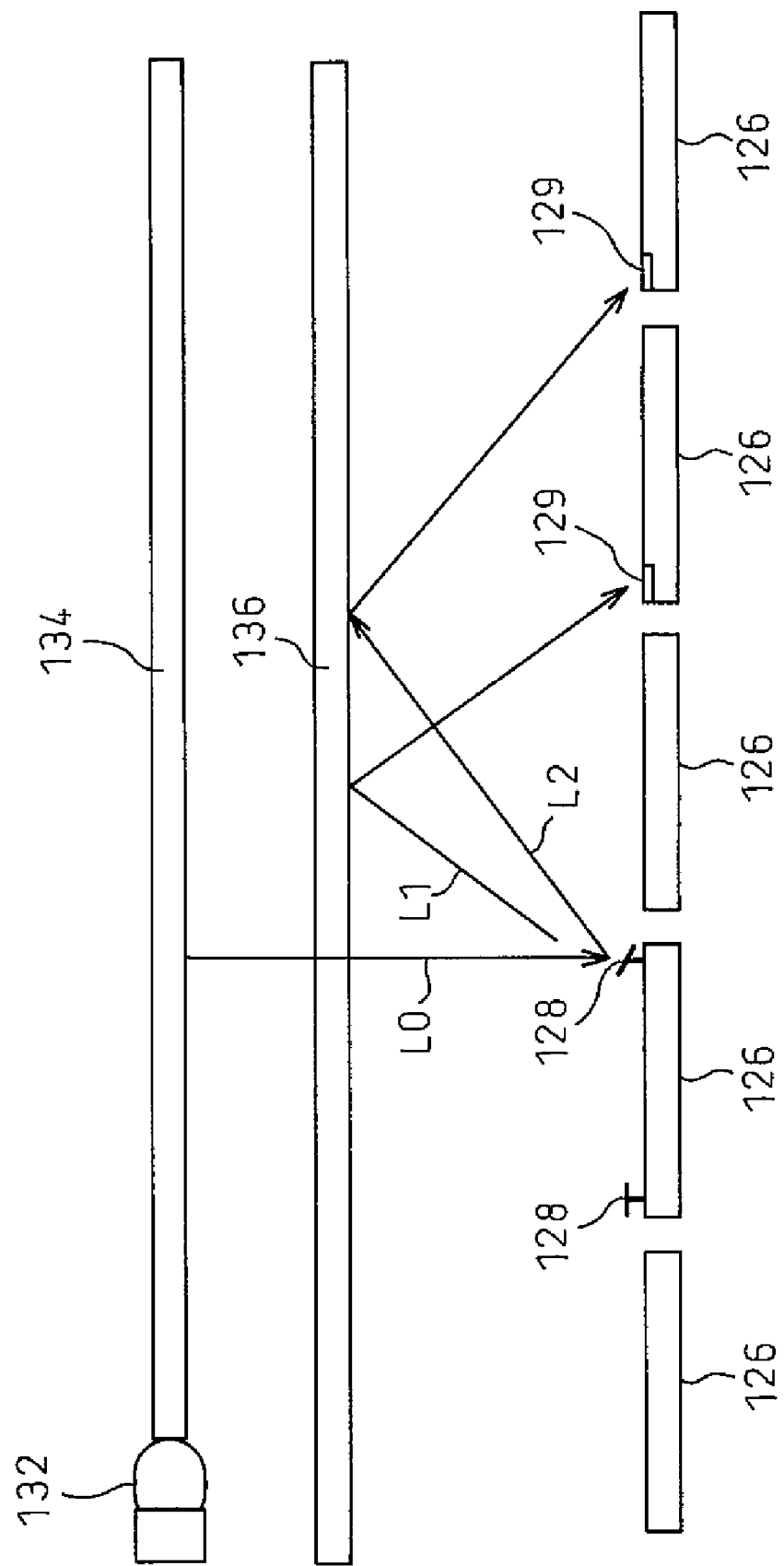
FIG. 10 is a view showing optical interconnects using the multimirror structure of the present invention.

FIG. 10 shows an example of an optical interconnect using a multimirror of Embodiment 3.

A large number of LSI devices 126 provided with pads 128 using multimirrors are arranged.

Light from a light source 132 proceeds in an optical waveguide sheet 134 toward the right in the figure and leaks to the sides as well. The leaked light L0 passes through a translucent mirror 136 and strikes a multimirror type optical pad 128 of an LSI device 126. The lights L1 and L2 reflected in various directions in accordance with the tilt angle of the optical pad 128 are reflected at the translucent mirror 136 and transmit signals to a light receiving parts 129 of the plurality of LSI devices 126, 126. The light receiving parts 129 are formed by the general Si pn junctions etc. The type of the light source 132 does not particularly have to be limited, but an LED is optimum. An LED is small in size and small in power consumption and a single one is sufficient for a plurality of LSI devices 126, so does not pose any practical disadvantages to reduction or size or reduction of power consumption of the system including the optical interconnects as a whole.

Embodiment 5

Torsional Deformation (Light Shutter or Optical Rotary Device)

The optical MEMS 100 explained in Embodiment 1 is of a mode where elastic bending deformation of the carbon nanotube elastic shaft 110 causes the top electrode 112 to tilt to the left or right, but by using a basic structure similar to FIG. 4(1) and changing the shapes or arrangements of the top and bottom electrodes, a mode is also possible where elastic torsional deformation of the carbon nanotube elastic shaft 110 causes the top electrode 112 to rotate.

As one such example, FIG. 11 are a (1) longitudinal cross-section and (2) plan view of a light shutter device as an optical MEMS using a movable device of the present invention. The cross-sectional view (1) is a longitudinal cross-section along the line A-A of the plan view (2).

The characterizing feature of the illustrated light shutter device 140 lies in its planar structure. That is, as shown in FIG. 11(2), in the initial state where no voltage is applied, the top electrode 112 is present from the top right to the bottom left about the carbon nanotube elastic shaft 110. As opposed to this, the bottom electrodes 108 are arranged at the top left and bottom right. The top and bottom electrodes are at positions offset rotated by about 90° about the elastic shaft 110, and the bottom electrodes 108 are not blocked by the top electrode 112. The cross-sectional structure, as shown in FIG. 11(1), is substantially the same as the reflection mirror 100 of Embodiment 1 and differs only on the point that the stoppers 114 are not required, so are not provided.

If applying voltage between the bottom electrodes 108 and the top electrode 112, drawn by the Coulomb force acting between two electrodes, the top electrode 112 rotates about the elastic shaft 110 as shown by the arrow R. Due to this rotation, the top right part of the top electrode 112 displaces toward a position covering the bottom right bottom electrode 108 and the bottom left part of the top electrode 112 displaces toward a position covering the top left bottom electrode 108. This rotational displacement is performed in the plane parallel to the top surfaces of the bottom electrodes 108 within the allowable range of elastic torsional deformation of the carbon nanotube elastic shaft 110.

By using the top electrode 112 as a light shielding plate and using the bottom electrodes 108 as reflection mirrors, the device functions as a light shutter 140. If controlling the voltage applied between two electrodes and adjusting the light shielding area of the top electrode 112 with respect to the bottom electrodes 108, the device functions as an optical modulator.

Note that in the present embodiment, the top electrode 112 was made a light shielding plate, but it is also possible to make only the part of a shape shown as the top electrode 112 in FIG. 11(2) in the square shaped top electrode similar to Embodiment 1 the light shielding region and make the other part a light passing region. For example, only the part to be made the light shielding region in the square shaped transparent plate is covered to block light.

Embodiment 6

Optical Rotary Device (Chiral Structure)

In Embodiment 5, the bottom electrodes 108 and top electrode 112 were provided in two directions with a phase difference of 90° about the shaft 110, but a mode where they are provided in more directions is also possible.

Figure 12:
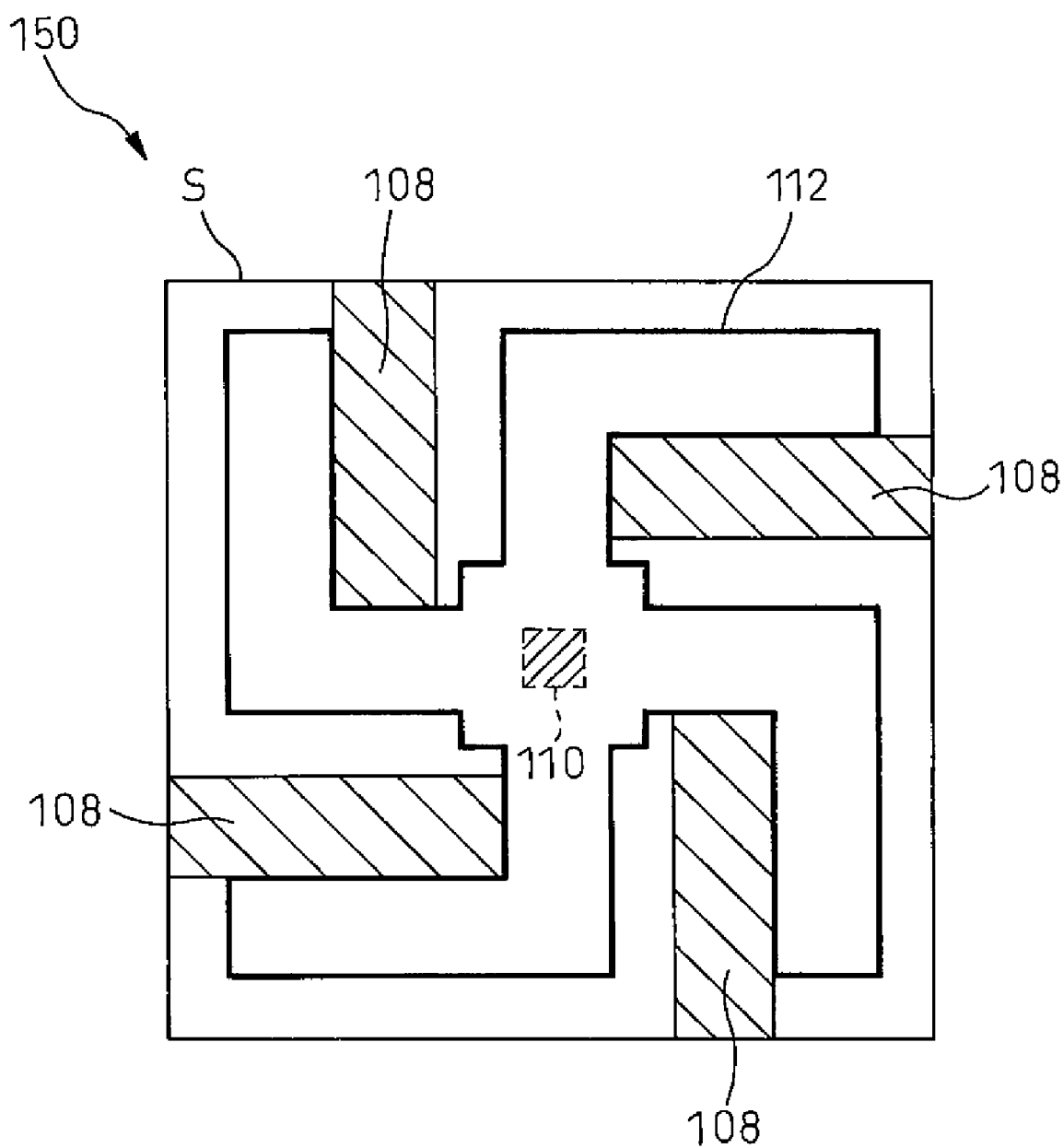
FIG. 12 is a plan view of a variable optical rotary device using a rotary type movable device of the present invention and provided with a chiral structure.

As one example, FIG. 12 is a plan view of a variable optical rotary device as an optical MEMS using a movable device of the present invention.

The illustrated variable optical rotary device 150 is formed so that four bottom electrodes 108 are arranged around the shaft 110 and four bent arms of a swastika shaped top electrode 112 are positioned so as not to be superposed over the four bottom electrode 108. This swastika shaped structure is called a "chiral structure" and exists in the natural world. It is known that when light is reflected at or passes through a structure of such a shape, an optical rotation phenomenon is caused where the plane of vibration of the light rotates. It has been reported that optical rotation occurs even when creating a structure of such a shape artificially.

In the variable optical rotary device 150 using an optical MEMS of the present embodiment, by controlling the voltage applied between the four bottom electrodes 108 and the top electrode 112, it is possible to freely change the angle of optical rotation by adjusting the rotational angle as the amount of rotational displacement of a chiral structure top electrode 112.

Embodiment 7

Elastic Deformation (Interference)

Figure 13:
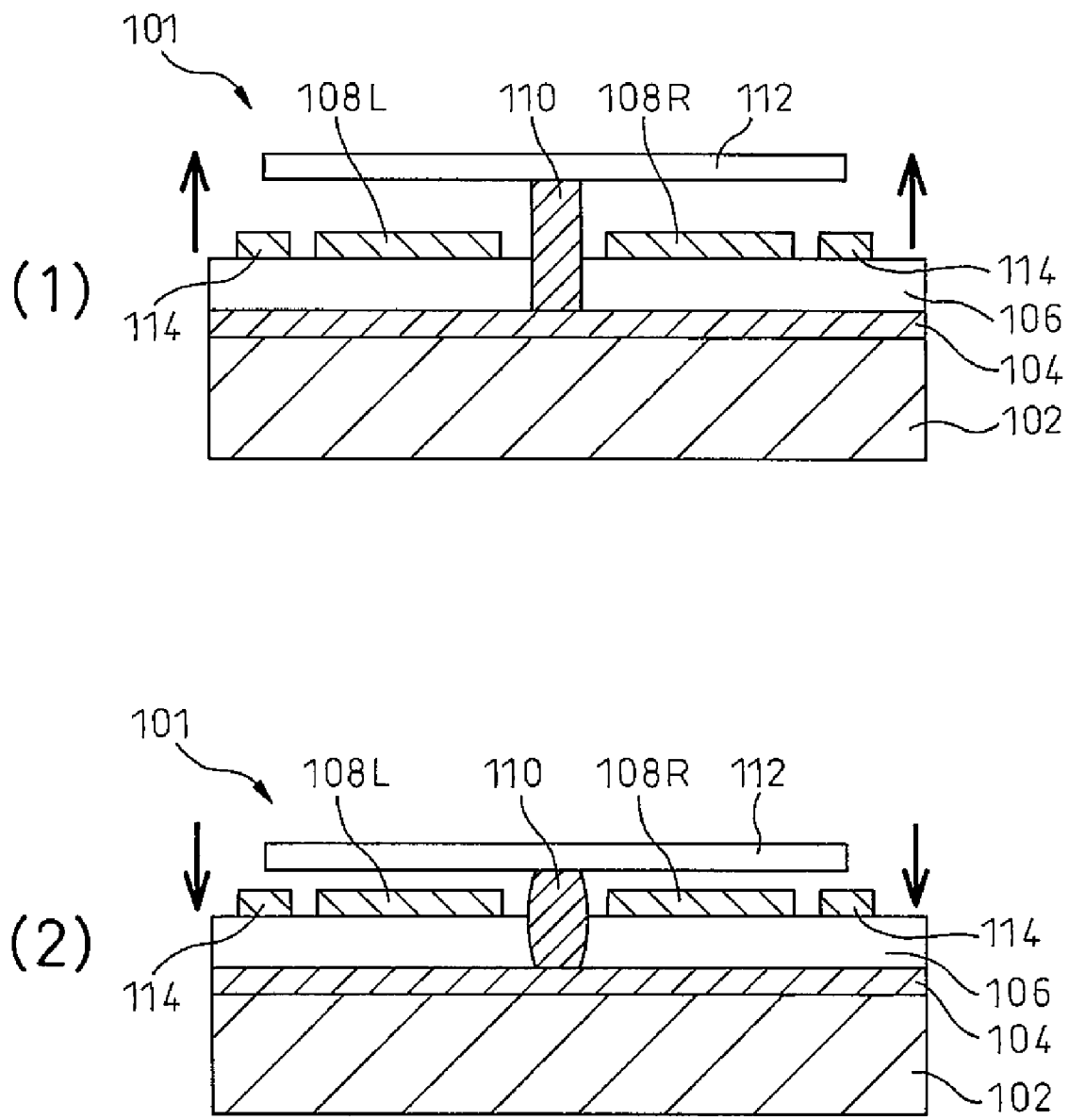
FIGS. 13(1) and (2) are longitudinal cross-sectional views of a reflection mirror device using a vertical movement type (expansion/contraction type) movable device of present invention.

The reflection mirror device 101 shown in FIG. 13 has the same configuration of members as the reflection mirror device 100 of Embodiment 1 shown in FIG. 4. The top surface of a top electrode 112 forms a mirror surface and functions as a reflection mirror. However, the operation differs. The reflection mirror device 100 of Embodiment 1 has voltage applied between one of the bottom electrodes 108 (R, L) and the top electrode 112 whereby the carbon nanotube elastic shaft 110 elastically deforms by bending to make the top electrode 112 tilt to the left or right. As opposed to this, the reflection mirror 101 device of the present embodiment has voltage applied between both of the bottom electrodes 108(R, L) and the top electrode 112 whereby the carbon nanotube elastic shaft 110 makes the top electrode 112 displace vertically due to elastic expansion/contraction deformation.

FIG. 13(1) shows the state where no voltage is applied. The carbon nanotube elastic shaft 110 is in a no-load state and remains at its initial length, while the top electrode 112 is at its top position (initial position).

FIG. 13(2) shows the state where voltage is applied between both the bottom electrodes 108(R, L) and the top electrode 112. Due to the force pulling the top and bottom electrodes together, the carbon nanotube elastic shaft 110 is elastically compressed in the axial direction and the top electrode 112 descends to its bottom position. Stoppers 114 are shown to prevent the top electrode 112 from flexing and contacting the bottom electrodes 108. If there is no such a concern, the stoppers 114 are unnecessary.

If application of voltage is stopped, the elastic shaft 110 is freed from the axial direction compression and expands whereupon the top electrode 112 rises and returns to the initial state of FIG. 13(1).

Figure 14:
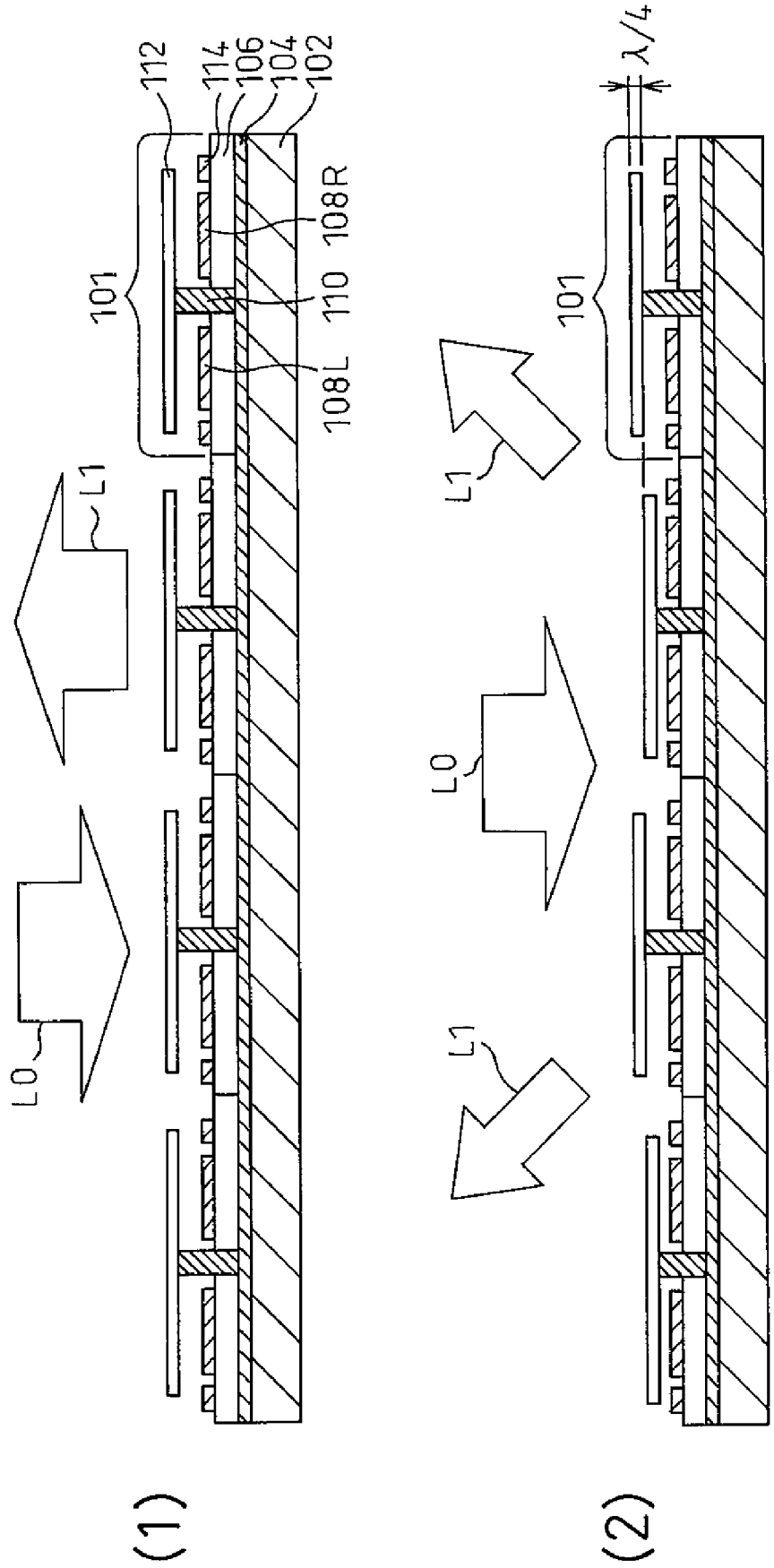
FIGS. 14(1) and (2) are longitudinal cross-sectional views showing a GLV device using a reflection mirror device of FIG. 13.

As shown in FIG. 14, by arranging a large number of the reflection mirror devices 101 of the present embodiment in parallel, it is possible to form a GLV (Grating Light Valve) device. A GLV device is a device used for diffraction of light. A diffraction grating is formed by mixing top position top electrodes 112 and bottom position top electrodes 112.

FIG. 14(1) shows the initial state where no voltage at all is applied to the reflection mirror devices 101. The parallel arranged top electrodes 112 are all arranged at the top positions. The reflected beams of light L1 of the light L0 incident from directly above are all matched in phase and matched in strength.

FIG. 14(2) shows the state where every other reflection mirror device 101 has voltage applied between the top electrode 112 and both the bottom electrodes 108(R, L). The top electrodes 112 are therefore alternately arranged at the top position and bottom position. If the difference in height between the top position and the bottom position is set to ¼ of the light wavelength λ, an optical path difference (phase difference) λ/4 is created between the beams of reflected light L1 from alternate reflection mirror devices 101 whereby light interference is artificially generated. By adjusting the height difference, it is possible to strengthen or weaken specific direction light. By using this technique, it is possible to form a projector or a moving 3D holographic display.

Embodiment 8

Flexural Deformation (Concave Mirror)

In the above embodiments, a single carbon nanotube elastic shaft 110 was used to support a top electrode 112 at one location, but in the present embodiment, a plurality of carbon nanotube elastic shafts 110 are used to support a top electrode 112 at a plurality of locations.

FIG. 15 show (1) a longitudinal cross-sectional view and (2) a plan view of a reflection mirror device of the present embodiment. The longitudinal cross-sectional view (1) is a cross-sectional view along the line A-A of the plan view (2). However, in the cross-sectional view (1), the amount of elastic flexural deformation of the top electrode 112 is drawn as the amount of deformation near the center cross-section of the top electrode 112.

The illustrated reflection mirror device 160 uses four carbon nanotube elastic shafts 110 to support a top electrode 112 at four locations. Voltage is applied between the bottom electrode 108 and the top electrode 112 to make the center part of the top electrode 112 flex downward. At that time, the carbon nanotube elastic shafts 110 elastically deform by bending toward the center part of the device 160.

The top electrode 112 of the reflection mirror device 160 functions as a concave mirror. By controlling the applied voltage, it is possible to control the curvature of the concave mirror, that is, the focal distance, and continuously or discontinuously change the convergence rate of the reflected light.

The reflection mirror device 160 of the present embodiment has basically an identical structure to the reflection mirror device 100 of Embodiment 1 except for there being four carbon nanotube elastic shafts 110 and can be produced by exactly the same production process.

In the above embodiments, the mode of application of the MEMS of the present invention to optical devices was explained, but the invention can be applied to various types of devices other than optical devices. First, the modes of use for a switch or memory will be explained below.

Embodiment 9

Switch (Tilt)

In the present embodiment, the mode of application of the MEMS of the present invention to a switch (electrical switch) will be explained. According to the present invention, a switch can be realized by a structure similar to an optical device.

As explained above, with high frequency circuits or RF circuits, the interference between circuits (parasitic capacitance and parasitic resistance) has to be eliminated as much as possible, so current transistors which only switch between a low resistance state and high resistance state between ON/OFF are insufficient. Rather, the old "switches" which completely cut or connected circuits—which were most prevalent before the appearance of transistors—are desirable since they can reduce the parasitic capacitance or parasitic resistance down to the ideal state.

Figure 16:
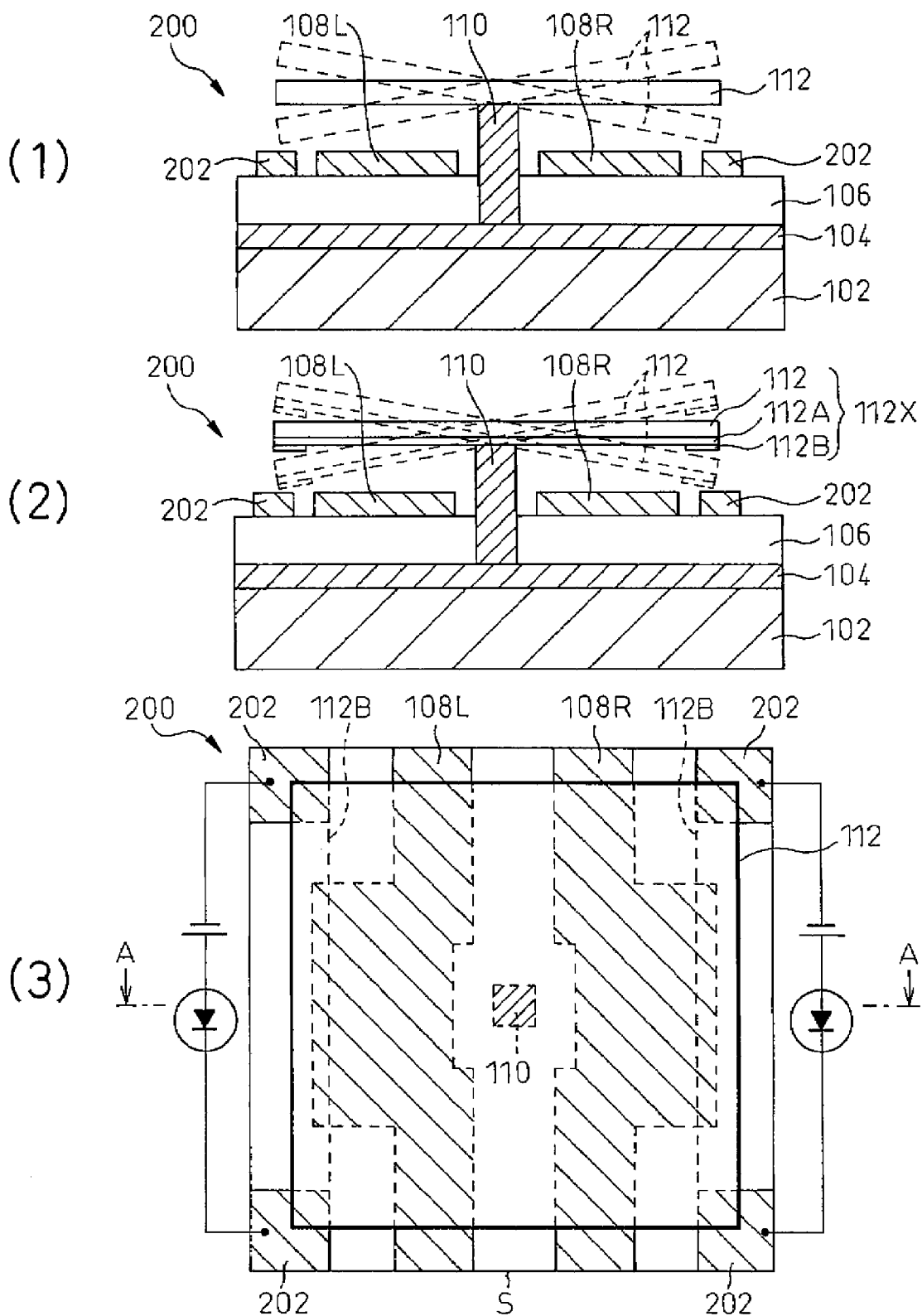
FIGS. 16(1) to (3) are (1) a longitudinal cross-sectional view, (2) a longitudinal cross-sectional view, and (3) a plan view showing a switch or memory using a tilt type movable device of the present invention.

The switch 200 shown in FIG. 16 has a structure similar to the optical device 100 of Embodiment 1 shown in FIG. 4. The same reference notations show the same members. However, the top electrode 112 functions not as a reflection mirror, but as a switch terminal. FIGS. 16(1) and (2) are longitudinal cross-sectional views, while (3) is a plan view common to (1) and (2) seen from above. The longitudinal cross-sectional views (1) and (2) are cross-sectional views along the line A-A of the plan view (3). The fixed terminals 202 originally do not appear in these cross-sections and are illustrated for convenience of explanation.

In FIG. 16, in the mode of (1), the top electrode 112 itself as a whole functions as a movable terminal. When the top electrode 112 tilts, its outer edge contacts the fixed terminals 202 on the insulation layer 106 of the substrate 102 and connects two fixed terminals 202. In the mode of (2), the top electrode 112 functions only for pure drive use. Separate movable terminals 112B are provided on an insulation layer 112A covering the bottom surface of the top electrode 112. When the top electrode 112 tilts, a movable terminal 112B contacts the fixed terminals 202 on the insulation layer 106 of the substrate 102 and connects the two fixed terminals 202. In the mode of (2), the top electrode 112, insulation layer 112A, and movable terminals 112B form an integral top structure 112X.

The switch 200 of the present embodiment can be formed to an extremely small size by a production process similar to the MEMS of Embodiment 1 shown in FIG. 4, so the operating speed is fast and the power consumption is small. Therefore, it is possible to mount it together with an LSI able to realize complicated circuits at a high density.

Note that the switch 200, in the same way as the reflection mirror device 100 of Embodiment 2 shown in FIG. 8, may arrange bottom electrodes 108 radially in the eight directions A to H and arrange fixed terminals 202 instead of the stoppers 114 to obtain an eight-contact switch (corresponding to former rotary switch).

Embodiment 10

Memory (Tilt)

It is also possible to apply the switch 200 of Embodiment 9 to a memory. The switch connects (ON) and disconnects (OFF) the interconnects, but by linking the ON/OFF state with 1/0 or 0/1, it can be made to function as a memory. Such a memory in general returns to OFF if application of voltage is stopped in the ON state resulting in a loss of stored data. That is, this forms a volatile memory.

However, when it comes to the extremely fine structure realized by an MEMS, the ratio of the surface area compared with the volume becomes very large, so the action of the van der Waals force etc. depending on the surface (surface force) becomes noticeable. In this case, by suitably setting the strength of the spring elasticity of the carbon nanotube elastic shaft 110, the situation may be obtained where even if the application of voltage is stopped in the ON state where the terminals are in contact, the terminals will not separate from each other due to the action of the above surface force. As a result, even if the application of voltage is stopped, the ON state is held and the corresponding 1/0 data is stored. That is, this forms a nonvolatile memory.

Further, even if applying the switch 200 to a memory, it is possible to arrange the bottom electrodes 108 radially in the directions A to H in the same way as the reflection mirror device 100 of Embodiment 2 shown in FIG. 8 and to obtain an eight-contact multivalue memory providing fixed terminals 202 instead of the stoppers 114. This multivalue memory can store eight, that is, 2 to the power of 3, 3-bit data, so increases the storage capacity to three-fold the 1-bit by a conventional DRAM (single value memory).

To erase the data stored in the nonvolatile memory by the tilting of the top electrode 112 of the present embodiment, voltage is applied to the bottom electrode 108 at a position axially symmetric about the shaft 110 from the bottom electrode 108 applied with voltage at the time of tilt.

Embodiment 11

Switch (Rotation)

Figure 17:
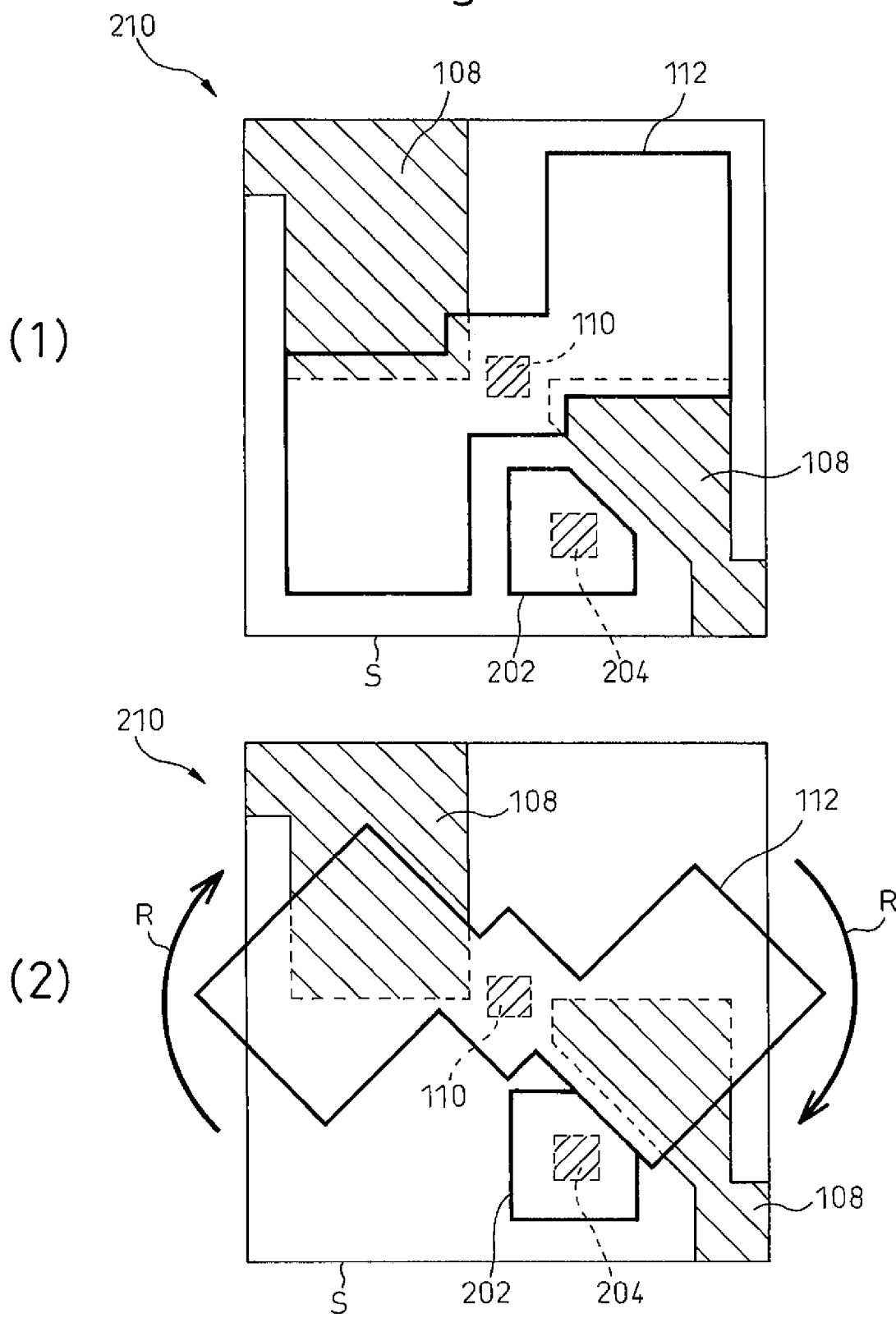
FIGS. 17(1) and (2) are plan views showing a switch or memory using a rotary type movable device of the present invention.

The switch 210 shown in FIG. 17 has a structure similar to the optical device 100 of Embodiment 5 shown in FIG. 11. The same reference notations show the same members. However, the top electrode 112 functions not as a reflection mirror, but a switch terminal.

FIG. 17 are plan views seen from above. (1) shows the state with no voltage applied, while (2) shows the state with voltage applied. The fixed terminal 202 is fixed to a top end of a carbon nanotube 204 with a bottom end fixed to a substrate 102 (FIG. 11) and has the same height as the top electrode 112.

In the initial state (1) with no voltage applied, the top electrode 112 is present from the top right to the bottom left centered about a carbon nanotube elastic shaft 110. As opposed to this, bottom electrodes 108 are arranged at the top left and bottom right. The top and bottom electrodes are positioned offset rotated by about 90° with respect to the elastic shaft 110.

If applying voltage between a bottom electrode 108 the top electrode 112, the top electrode 112 rotates about the elastic shaft 110 as shown by the arrow R by being drawn by the Coulomb force acting on the two electrodes. Due to this rotation, the top right part of the top electrode 112 displaces toward the position covering the bottom right bottom electrode 108 and the bottom left part of the top electrode 112 displaces toward the position covering the top left bottom electrode 108. This rotational displacement is performed in a plane parallel to the top surface of the bottom electrodes 108 within the allowable range of elastic torsional deformation of the carbon nanotube elastic shaft 110. As shown in FIG. 17(2), the right side part of the top electrode 112 stops in the state abutting against the fixed terminal 202. That is, the top electrode 112 itself contacts the fixed terminal 202 as a movable terminal resulting in the ON state. If the application of voltage is stopped in this state, the elasticity of the carbon nanotube elastic shaft 110 causes the top electrode 112 to rotate in the reverse direction to the arrow R and return to the initial state (1) whereby the switch 210 becomes the OFF state.

Embodiment 12

Memory (Rotation)

The rotary switch 210 of Embodiment 11 can also be applied to a memory. The principle is similar to the case of applying the switch 200 of the above-mentioned Embodiment 9 to the memory of Embodiment 10. In this case as well, volatile and nonvolatile memories are possible. To erase the data stored in the nonvolatile memory due to rotation of the top electrode 112 of the present embodiment, another pair of bottom electrodes 108 are provided at positions left-right symmetrical with the top left and bottom right pair of bottom electrodes 108 shown in FIG. 17, that is, at the bottom left and top right. Voltage is applied between these and the top electrode 112.

Embodiment 13

Switch (Flexure)

The switch 220 shown in FIG. 18 is a structure similar to the optical device 160 of Embodiment 8 shown in FIG. 15. The same reference notations show the same members. However, the top electrode 112 functions not as a reflection mirror, but as a switch terminal. FIG. 18(1) is a longitudinal cross-sectional view, while (2) is a plan view seen from above. The longitudinal cross-sectional view (1) is a cross-sectional view along the line A-A of the plan view (2). The carbon nanotube elastic shafts 110 and fixed terminals 202 originally do not appear at this cross-section and are shown for convenience of explanation.

The switch 220 uses four carbon nanotube elastic shafts 110 to support the top electrode 112 at four locations. Voltage is applied between the bottom electrodes 108 and the top electrode 112 to make the center part of the top electrode 112 flex downward. At that time, the carbon nanotube elastic shafts 110 elastically deform by bending toward the center part of the device 160.

The top electrode 112 functions only for pure driving use. The bottom surface of the top electrode 112 is covered by an insulation layer 11A on which a movable terminal 112B is separately provided. When the center part of the top electrode 112 flexes downward, the movable terminal 112B contacts the fixed terminals 202 on the insulation layer 106 of the substrate 102 and connects the two fixed terminals 202. The top electrode 112, the insulation layer 112A, and the movable terminal 112B form an integral top structure 112X.

Embodiment 14

Memory (Flexure)

It is also possible to apply the flexing switch 220 of Embodiment 13 to a memory. The principle is similar to the above-mentioned case of applying the switch 200 of Embodiment 9 to a memory of Embodiment 10. In this case as well, volatile and nonvolatile memories are possible. To erase data stored in a nonvolatile memory due to flexure of the top electrode 112 of the present embodiment, a separate fixed electrode is provided above the top electrode 112 and voltage is applied between this fixed electrode and the top electrode 112 to generate a Coulomb force lifting up the top electrode 112.

Embodiment 15

Switch (Expansion/Contraction)

Figure 19:
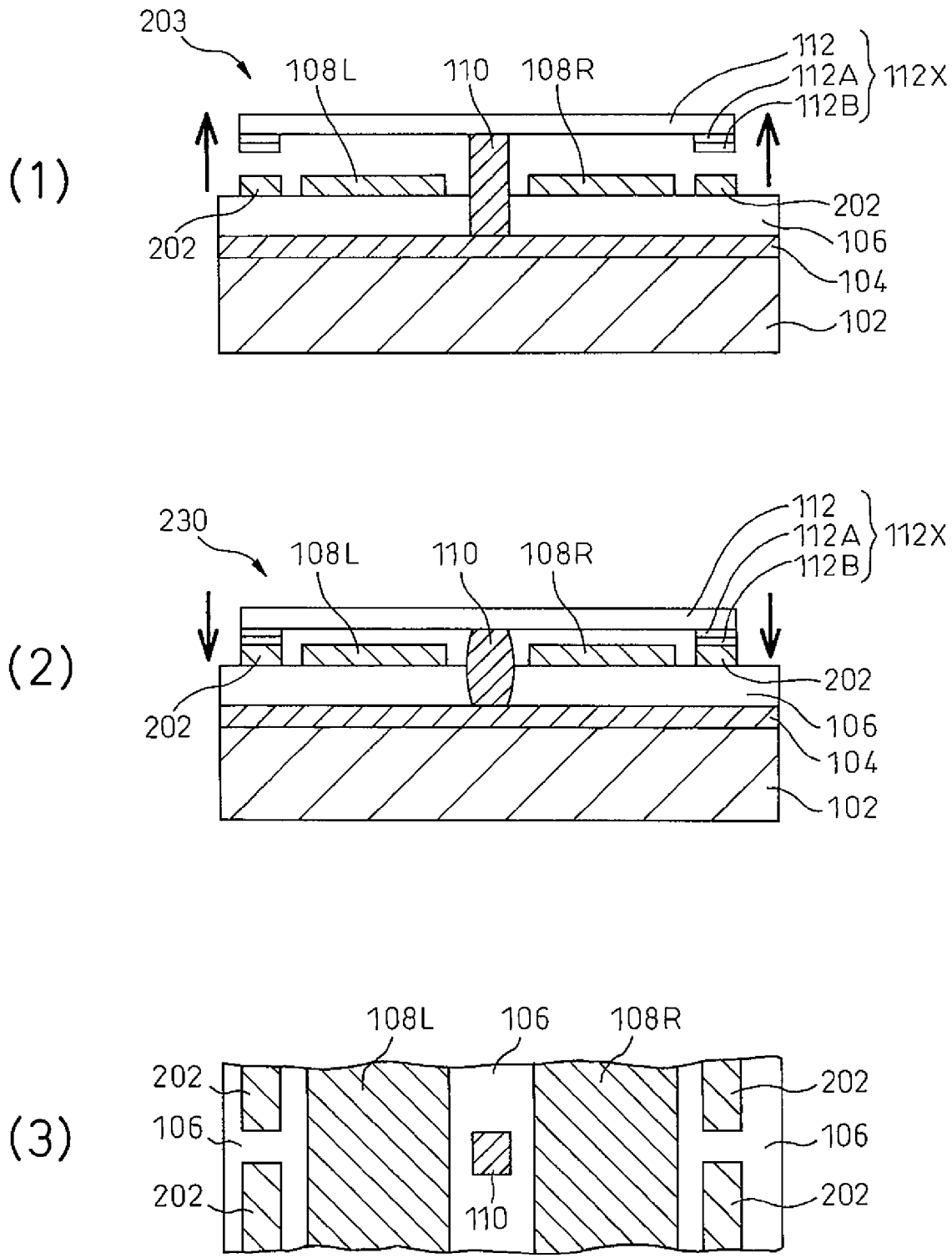
FIGS. 19(1) to (3) are (1) a longitudinal cross-sectional view, (2) a longitudinal cross-sectional view, and (3) a plan view showing a switch or memory using a vertical movement type (expansion/contraction type) movable device of present invention.

The switch 230 shown in FIG. 19 is configured similar to the reflection mirror device 101 of Embodiment 7 shown in FIG. 13 and operates utilizing the elastic expansion/contraction deformation in the axial direction of the carbon nanotube elastic shaft 110 standing at the center. The points of difference from Embodiment 7 are that the top electrode 112 functions not as a reflection mirror, but simply as a movable electrode and is provided at its bottom surface with an insulation layer 112A and movable terminals 112B and that fixed terminals 202 are provided on the insulation layer 106. Left and right pairs of fixed terminals 202 are, as shown by the plan view in FIG. 19(3), provided separated from each other on the insulation layer 106. The top electrode 112, insulation layer 112A, and movable terminals 112B form an integral top structure 112X. Note that in FIG. 19(3), the top structure 112X is not shown.

The switch 230 operates in the same way as the reflection mirror 101 of Embodiment 7. If applying voltage from the initial state of no voltage application of FIG. 19(1) to between both bottom electrodes 108(R, L) and the top electrode 112, as shown in FIG. 19(2), the attraction force between the bottom and top electrodes causes the carbon nanotube elastic shaft 110 to be elastically compressed in the axial direction and the top electrode 112 to descend to the bottom position where the movable terminals 112B contact the fixed terminals 202 and connect the two fixed terminals 202.

Embodiment 16

Memory (Expansion/Contraction)

The expansion/contraction switch 230 of Embodiment 15 can also be applied to a memory. The principle is similar to the case of applying the switch 200 of the above-mentioned Embodiment 9 to the memory of Embodiment 10. In this case as well, volatile and nonvolatile memories are possible. To erase the data stored in the nonvolatile memory due to compression of the carbon nanotube elastic shaft 110 of the present embodiment, another fixed electrode is provided above the top electrode 112 and voltage is applied between this fixed electrode and the top electrode 112 to generate a Coulomb force lifting up the top electrode 112.

Above, examples of application of the movable device of the present invention to optical devices, switches, and memories were explained. Next, examples of application of a movable device of the present invention to variable capacitors will be explained. In each of the modes of variable capacitors shown below, the top electrode 112 does not have to function as a mirror and need only function as a movable electrode.

Embodiment 17

Variable Capacitor (Tilt)

It is possible to use the mode of the reflection mirror device using tilt of Embodiment 1 shown in FIG. 4, FIG. 5, and FIG. 6 to a variable capacitor. Voltage is applied between only one of the illustrated bottom electrodes, that is, 108R (or 108L), and the top electrode 112 and a capacitor is formed between the other bottom electrode 108L (or 108R) and the facing part of the top electrode 112. By controlling the applied voltage, it is possible to control the tilt angle of the top electrode 112 and change the distance between the above other bottom electrode and facing part of the top electrode so as to change the capacity of the capacitor.

Embodiment 18

Variable Capacitor (Rotation)

Further, it is possible to use the mode of the reflection mirror device using rotation (torsional deformation) of Embodiment 5 shown in FIG. 11 to a variable capacitor. In this case as well, voltage is applied between only one of the illustrated bottom electrodes 108 and the top electrode 112 and a capacitor is formed between the other bottom electrode and the part of the top electrode 112 facing the same. That is, by applying voltage between the top and bottom electrodes, the top electrode 112 rotates, the amount of overlap with the top electrode changes, and the capacity of the capacitor changes. By controlling the applied voltage, it is possible to change the capacity of the capacitor.

Embodiment 19

Variable Capacitor (Horizontal Movement)

Figure 20:
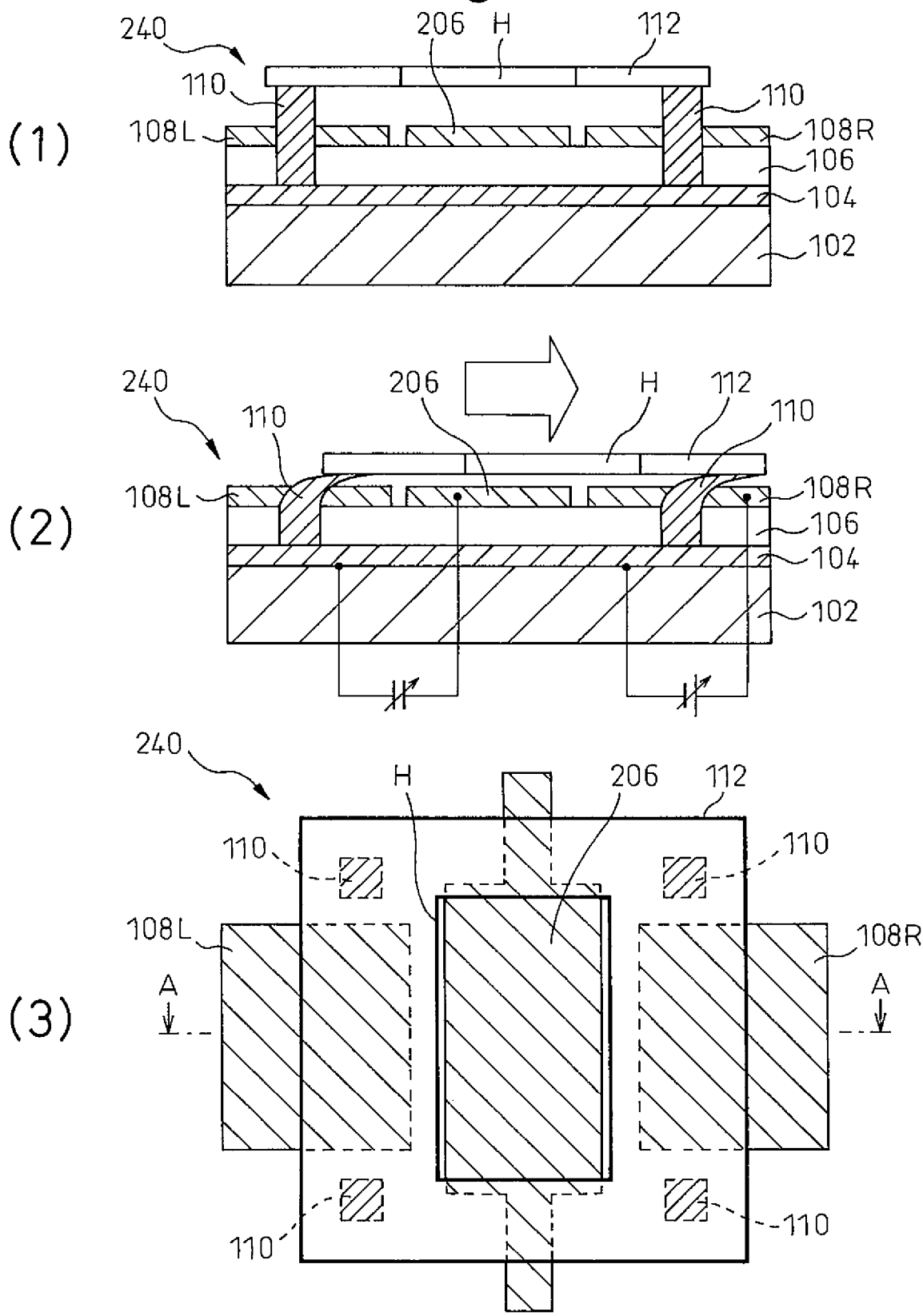
FIGS. 20(1) to (3) are (1) a longitudinal cross-sectional view, (2) a longitudinal cross-sectional view, and (3) a plan view showing a variable capacity capacitor using a horizontal movement type movable device of the present invention.

In the same way, as a mode for changing the amount of overlap between top and bottom electrodes, as shown in FIG. 20, a mode is possible where a plurality of carbon nanotube elastic shafts 110 support a top electrode 112 at a plurality of locations. In FIG. 20, (1) is a longitudinal cross-sectional view of the initial state with no voltage applied, (2) is a longitudinal cross-sectional view of the state with voltage applied, and (3) is a plan view as seen from above. (1) and (2) are cross-sectional views along the line A-A of (3). The carbon nanotube elastic shafts 110 originally do not appear in these cross-sections, but are illustrated for convenience of explanation.

As shown in FIGS. 20(1) and (3), the variable capacitor 240 is comprised of an insulation layer 106 on which a counter electrode 206 of a capacitor is provided. A frame shaped top electrode 112 having an opening H at its center part is supported at its four corners by four carbon nanotube elastic shafts 110. The top electrode 112 and the counter electrode 206 form a capacitor.

As shown in FIG. 17(2), if applying voltage between either of the right and left bottom electrodes 108R, 108L (in the illustrated example, the right bottom electrode 108R) and the top electrode 112, the top electrode 112 moves in the lateral direction toward the bottom electrode (108R) to which voltage is applied. At that time, the carbon nanotube elastic shafts 110 elastically deform by bending in the direction of movement of the top electrode 112. Due to this, the amount of overlap of the counter electrode 206 and the top electrode 112 changes and the capacity of the capacitor changes. By controlling the applied voltage, the amount of overlap is controlled to control the capacity of the capacitor.

Embodiment 20

Variable Capacitor (Flexure)

Furthermore, the mode of the optical device 160 using flexural deformation of Embodiment 8 shown in FIG. 15 may be applied to a variable capacitor. An example is shown in FIG. 21 by (1) a longitudinal cross-sectional view and (2) a plan view seen from above. The longitudinal cross-sectional view (1) is a cross-sectional view along the line A-A of the plan view (2). The carbon nanotube elastic shaft 110 originally does not appear in this cross-section, but is illustrated for convenience of explanation.

As shown in FIG. 21, the variable capacitor 250 is comprised of an insulation layer 106 on which a counter electrode 206 of a capacitor is provided. A pair of bottom electrodes 108 is arranged at the two sides. The top electrode 112 (shown by broken line in FIG. 21(1)) is supported at its four corners by four carbon nanotube elastic shafts 110. The top electrode 112 and the counter electrode 206 form a capacitor.

If applying voltage between the two bottom electrodes 108 and the top electrode 112, the center part of the top electrode 112 flexes downward due to the attraction with the counter electrode 206. Due to this, the clearance with the counter electrode 206 changes and the capacity of the capacitor changes. The applied voltage is controlled to control the amount of downward flexure and control the capacity of the capacitor.

Embodiment 21

Movable Antenna

The movable device of the present invention can be applied to a movable antenna. One example is shown in FIG. 22 by (1) a longitudinal cross-sectional view and (2) a plan view seen from above. The longitudinal cross-sectional view (1) is a cross-sectional view along the line A-A of the plan view (2). Each shows the initial state where no voltage is applied.

The illustrated movable antenna 260 has the same basic structure as the optical device 140 of Embodiment 5 shown in FIG. 11 plus an antenna and an antenna lead wire formed by a carbon nanotube elastic shaft. The same reference notations as in FIG. 11 show the same members.

The top electrode 112 has an antenna 208 provided on it through an insulation layer 112C. The carbon nanotube elastic shaft 110 has a double layer structure comprised of a hollow shaped carbon nanotube elastic shaft 110A with a bottom end fixed to a basic conductive layer 104 on the substrate 102 and with a top end fixed to the top electrode 112 and a separate carbon nanotube elastic shaft 110B passing through the hollow part of this elastic shaft A and with a bottom end fixed to a separate basic conductive layer 105 of the substrate 102 and with a top end fixed to the antenna 208. The top electrode 112, insulation layer 112C, and antenna 112D form the top structure 112X.

The operation is also similar to the optical device 140 of Embodiment 5. By applying voltage, the top structure 112X including the top electrode 112 rotates as shown by the arrow R toward the closest bottom electrode 108(R, L) and stops at a position where the rotational drive force due to the Coulomb force and the elasticity due to the torsional deformation of the carbon nanotube elastic shaft 110 balance each other.

By using the rotational angle of the antenna 112D provided on the top structure 112X to change the direction of orientation of the antenna and receive or send out signals in only specific directions, efficient use is possible even with weak signals and power can be saved. For example, it is possible to greatly reduce the battery consumption of a mobile phone.

Note that the case of applying voltage to both of the pair of bottom electrodes 108 to make the antenna 112D rotate was explained, but it is also possible to apply voltage to only one bottom electrode 108 for operation combining rotation and tilt.

Embodiment 22

Rotary Motor+Gear

The movable device of the present invention may be applied to a rotary motor. One example is shown in FIG. 23 by (1) a longitudinal cross-sectional view and (2) a plan view seen from above. The longitudinal cross-sectional view (1) is a cross-sectional view along the line A-A of the plan view (2). Each shows the initial state where no voltage is applied.

The figures show a rotary motor 270 (left side) and a driven device 275 gear engaged with this (right side). The two are fabricated on the same substrate 102. The rotary motor 270 is comprised of the same basic structure as the optical device 140 using rotation of Embodiment 5 shown in FIG. 11 plus the provision of a gear 112G at the outer circumference of the top electrode 112. The same reference notations as in FIG. 11 show the same members. The top electrode 112 and the gear 112G form the top structure 112X.

The operation is similar to the optical device 140 of Embodiment 5. In the rotary motor 270, due to the application of voltage, the top structure 112X including the top electrode 112 rotates as shown by the arrow R1 toward the closest bottom electrode 108. The driven device 275 meshed with this rotates as shown by the arrow R2. In this way, it is possible to configure a power transmission mechanism transmitting movement of the drive part 270 to the driven device 275.

Note that in the present embodiment, the case where the mode of operation of the motor is rotation was explained as a typical example, but the invention is not limited to this. Motors having as operation modes any of the modes of displacement of the movable device of the present invention explained in the above embodiments, that is, tilting, rotation, vertical movement (expansion/contraction of shaft), flexure, and horizontal movement, are possible.

Further, as the mode of engagement, gear meshing was shown, but engagement by a chain and sprocket or other mode of engagement for transmission of power is also possible.

Above, modes causing active operation for action on the outside in the movable devices of the present invention were explained. Below, examples of application to sensors will be explained as modes passively operating or affected in operation by external action in the movable devices of the present invention.

Embodiment 23

Acceleration Sensor

First, an example of an acceleration sensor will be explained as a movable device of the present invention operating passively due to external action.

Figure 24:
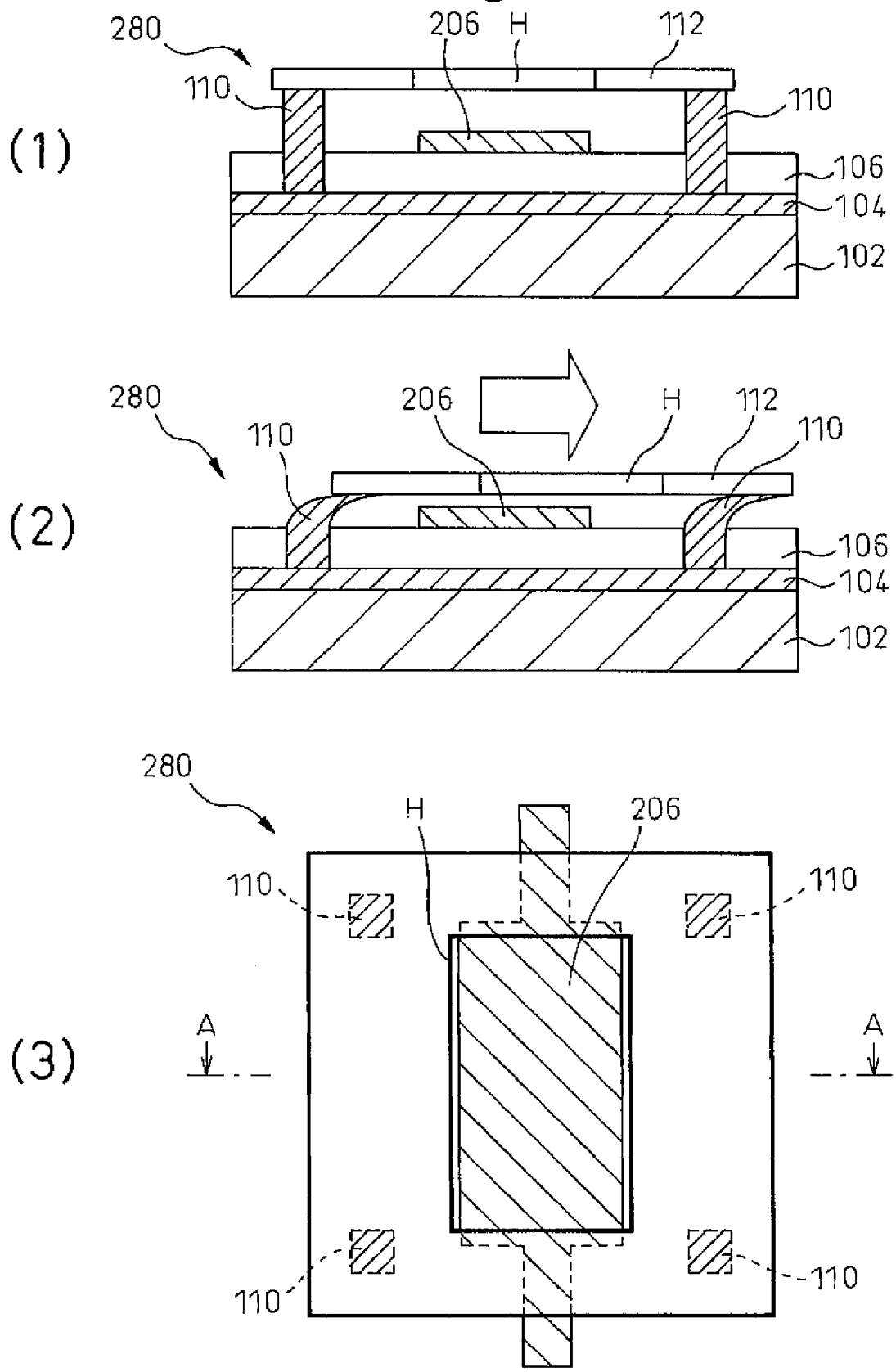
FIGS. 24(1) to (3) are (1) a longitudinal cross-sectional view, (2) a longitudinal cross-sectional view, and (3) a plan view shown an acceleration sensor using a horizontal movement type movable device of the present invention.

An acceleration sensor 280 using a movable device of the present invention shown in FIG. 24 comprises the structure of the variable capacitor 240 shown in FIG. 20 minus the bottom part 108 for voltage application. In the two figures, the same reference notations indicate the same members. In FIG. 24, (1) is a longitudinal cross-sectional view of the initial state with no acceleration, (2) is a longitudinal cross-sectional view of the state with acceleration received, and (3) is a plan view seen from above of the initial state. (1) and (2) are cross-sectional views along the line A-A of (3). The carbon nanotube elastic shafts 110 originally do not appear in these cross-sections, but are illustrated for convenience in explanation.

As shown in FIGS. 24(1)(3), the acceleration sensor 280 is comprised of an insulation layer 106 on which a counter electrode 206 is provided. A frame shaped top electrode 112 having an opening H at its center part is supported at its four corners by four carbon nanotube elastic shafts 110.

As shown in FIG. 24(2), if acceleration acts in the arrow direction, the top electrode 112 horizontally moves in the direction of acceleration. At that time, the carbon nanotube elastic shafts 110 elastically deform by bending in the direction of movement of the top electrode 112. Due to this, the amount of overlap of the counter electrode 206 and the top electrode 112 changes and the electrostatic capacity between the two changes. This change in the electrostatic capacity is used to detect the acting acceleration.

In this way, the acceleration sensor according to the present invention utilizes the changes in the electrostatic capacity between the top electrode 112 and the counter electrode 206, so it is possible to use the various structures explained in the embodiments of the variable capacitors minus the bottom electrodes for voltage application.

Embodiment 23

Mass Sensor

Next, an example of a mass sensor will be explained as a movable device affected in operation by external action.

A mass sensor 290 using a movable device of the present invention shown in FIG. 25 has the same structure as the optical device 100 based on tilting of Embodiment 1 shown in FIG. 4, J2. The same reference notations show the same members. However, the top electrode 112 functions not as a reflection mirror, but as an adsorption member.

As shown in FIG. 25(1), when an external substance P is adsorbed at the surface of the top electrode 112, the mass of the top electrode 112 appears to increase, though only slightly, and the resonance frequency changes. It is possible to alternately apply voltage to the right and left bottom electrodes 108R, 108L to make the top electrode 112 tilt to the left and right, find the resonance frequency at that time, and find the mass of the external substance P based on that.

The mass sensor 290 is very small in size, so can even detect an external substance P such as a chemical substance, atoms, DNA, etc. and can be utilized for external substances with known masses.

Note that in the present embodiment, the case where the operating mode of the sensor is, as a typical example, rotation, was explained, but the invention is not limited to this. Sensors having as operation modes any of the modes of displacement of the movable device of the present invention explained in the above embodiments, that is, tilting, rotation, vertical movement (expansion/contraction of shaft), flexure, and horizontal movement, are possible.

In the above embodiments, the explanation was given of the case where the movable device of the present invention functioned as one of an optical device, electrical switch, memory, variable capacity capacitor, movable antenna, and motor. However, the movable device of the present invention does not have to be limited to a single function and may also be provided with a plurality of functions.

For example, the switch 200 of Embodiment 9 shown in FIG. 16, in the same way as the optical device 100 of Embodiment 1 shown in FIG. 4, can simultaneously provide the two functions of a switch and reflection mirror device. In the same way, the switch 210 of Embodiment 11 shown in FIG. 17 can take a mode in which it also functions as a light shutter of Embodiment 4 of FIG. 11.

Further, in the above Embodiments, the case was explained of a mode in which the movable device of the present invention takes one mode of displacement of any of tilting, rotation, vertical movement (expansion/contraction of shaft), flexure, and horizontal movement. However, the present invention is not limited to this. It is also possible to obtain displacement mode movable device combining a plurality of displacement modes.

The invention claimed is:

1. A movable device provided with bottom electrodes and a basic conductive layer fixed to a substrate, an elastic shaft of a carbon nanotube with a bottom end fixed on said basic conductive layer and standing up, and a top structure including a top electrode spaced away from said bottom electrode and fixed to a top end of said elastic shaft, wherein when applying voltage between a said bottom electrode and said top electrode, said top electrode displaces relatively to said bottom electrodes within an allowable range of elastic deformation of said elastic shaft.

2. A movable device as set forth in claim 1, wherein said top structure is displaced by tilt, flexural deformation, or horizontal movement within an allowable range of elastic bending deformation of the above elastic shaft.

3. A movable device as set forth in claim 1, wherein said top structure displaces by rotation about said elastic shaft in an allowable range of elastic torsional deformation of the above elastic shaft.

4. A movable device as set forth in claim 1, wherein said top structure displaces by vertical movement in an allowable range of elastic expansion/contraction deformation of the above elastic shaft.

5. A movable device as set forth in claim 1, forming any of an optical device, electrical switch, memory, variable capacity capacitor, movable antenna, or motor.

6. A movable device as set forth in claim 2, forming any of an optical device, electrical switch, memory, variable capacity capacitor, movable antenna, or motor.

7. A movable device as set forth in claim 3, forming any of an optical device, electrical switch, memory, variable capacity capacitor, movable antenna, or motor.

8. A movable device as set forth in claim 4, forming any of an optical device, electrical switch, memory, variable capacity capacitor, movable antenna, or motor.

9. A movable device as set forth in claim 5, forming an optical device provided with a reflection mirror at said top structure.

10. A movable device as set forth in claim 9, wherein said top structure is provided with a light shielding region and a light passing region and said bottom electrodes are provided with mirror regions on their top surfaces.

11. A movable device as set forth in claim 9, wherein said top structure forms a chiral structure.

12. A movable device as set forth in claim 5, forming an electrical switch or memory provided with a movable terminal at said top structure and provided With a fixed terminal on said insulation layer.

13. A movable device as set forth in claim 5, forming a variable capacitor comprised of the above insulation layer on which a counter electrode for the top electrode is provided.

14. A movable device as set forth in claim 5, forming a movable antenna provided with an antenna part at said top structure.

15. A movable device as set forth in claim 5, forming a motor provided with a gear or sprocket for transmission of power at said top structure.

16. A movable device provided with bottom electrodes and a basic conductive layer fixed to a substrate, an elastic shaft of a carbon nanotube with a bottom end fixed on said basic conductive layer and standing up, and a top structure including a top electrode spaced away from said bottom electrode and fixed to a top end of said elastic shaft, wherein when said top structure displaces relative to said bottom electrode in an allowable range of elastic deformation of said carbon nanotube, acceleration at that time is output as a change of electrostatic capacity between the two electrodes due to said displacement to thereby form an acceleration sensor.

17. A movable device provided with bottom electrodes and a basic conductive layer fixed to a substrate, an elastic shaft of a carbon nanotube with a bottom end fixed on said basic conductive layer and standing up, and a top structure including a top electrode spaced away from said bottom electrode and fixed to a top end of said elastic shaft, wherein an external mass applied to said top electrode is output as a change of resonance frequency of vibrational displacement of said top electrode with respect to said bottom electrode in an allowable range of elastic deformation of said carbon nanotube to thereby form a mass sensor.

18. A movable device as set forth in claim 16, wherein said top structure displaces by tilting, flexural deformation, or horizontal movement in the allowable range of elastic bending deformation of the above elastic shaft.

19. A movable device as set forth in claim 16, wherein said top structure displaces due to rotation about said elastic shaft within an allowable range of elastic torsional deformation of said elastic shaft.

20. A movable device as set forth in claim 16, wherein said top structure displaces by vertical movement in the allowable range of elastic expansion/contraction deformation of said elastic shaft.

* * * * *